(12) United States Patent
Bash et al.

(10) Patent No.: US 6,938,433 B2
(45) Date of Patent: Sep. 6, 2005

(54) COOLING SYSTEM WITH EVAPORATORS DISTRIBUTED IN SERIES

(75) Inventors: Cullen E. Bash, San Francisco, CA (US); Chandrakant D. Patel, Freemont, CA (US)

(73) Assignee: Hewlett-Packard Development Company, LP., Houston, TX (US)

( * ) Notice: Subject to any disclaimer, the term of this patent is extended or adjusted under 35 U.S.C. 154(b) by 23 days.

(21) Appl. No.: 10/309,196

(22) Filed: Dec. 4, 2002

(65) Prior Publication Data

US 2004/0020226 A1 Feb. 5, 2004

Related U.S. Application Data

(63) Continuation-in-part of application No. 10/210,040, filed on Aug. 2, 2002, now abandoned.

(51) Int. Cl.[7] .............................. F25B 1/00; F25B 49/00
(52) U.S. Cl. .............................. 62/229; 62/198; 62/225
(58) Field of Search ............................. 62/228.4, 229, 62/199, 203, 178, 180, 198, 225

(56) References Cited

U.S. PATENT DOCUMENTS

| 3,334,684 | A | | 8/1967 | Roush et al. |
| 4,313,310 | A | | 2/1982 | Kobayashi et al. |
| 4,874,127 | A | * | 10/1989 | Collier ...................... 236/49.3 |
| 5,142,877 | A | | 9/1992 | Shimizu |
| 5,181,392 | A | * | 1/1993 | Itoh et al. ...................... 62/160 |
| 5,222,371 | A | | 6/1993 | Doyama et al. |
| 5,253,482 | A | | 10/1993 | Murway |
| 5,365,749 | A | | 11/1994 | Porter |
| 5,600,962 | A | | 2/1997 | Aizawa et al. |
| 5,718,628 | A | * | 2/1998 | Nakazato et al. ........... 454/184 |
| 5,737,931 | A | | 4/1998 | Ueno et al. |
| 6,034,873 | A | | 3/2000 | Wallace et al. |
| 6,205,803 | B1 | | 3/2001 | Scaringe |
| 6,283,380 | B1 | * | 9/2001 | Nakanishi et al. ......... 236/49.3 |
| 6,374,627 | B1 | * | 4/2002 | Schumacher et al. ...... 62/259.2 |
| 6,494,050 | B2 | * | 12/2002 | Spinazzola et al. ............ 62/89 |
| 6,557,357 | B2 | * | 5/2003 | Spinazzola et al. ............ 62/89 |
| 6,557,624 | B1 | * | 5/2003 | Stahl et al. .................... 165/53 |
| 2002/0059804 | A1 | | 5/2002 | Peltz et al. |

OTHER PUBLICATIONS

Stahl, L , et al: "Telecool, A new generation of cooling systems for switching equipment", On Ericsson Review, Stockholm, SE, vol 69, nr. 4, pp. 124–132 XP000354460.

* cited by examiner

Primary Examiner—Marc Norman

(57) ABSTRACT

A system and method for cooling a room configured to house a plurality of computer systems. A plurality of evaporator units are arranged in series and are configured to receive air from the room and to deliver air to the room. The evaporator units are supplied with refrigerant operable to cool the received air in the evaporator units. At least one of the temperature of the refrigerant supplied to the evaporator units and the air delivery to the room may be controlled in response to temperatures sensed at one or more locations in the room.

36 Claims, 10 Drawing Sheets

COOLING SYSTEM WITH EVAPORATORS DISTRIBUTED IN SERIES

CROSS-REFERENCES

The present invention is a continuation-in-part of U.S. application Ser. No. 10/210,040, filed Aug. 2, 2002 abandoned, and entitled "COOLING SYSTEM", by Patel et al., and is related to the following applications: co-pending U.S. application Ser. No. 10/309,188, filed Dec. 4, 2002, and entitled "COOLING SYSTEM WITH EVAPORATORS DISTRIBUTED IN PARALLEL" by Bash et al.; co-pending U.S. application Ser. No. 09/970,707, filed Oct. 5, 2001, and entitled "SMART COOLING OF DATA CENTERS", by Patel et al.; U.S. application Ser. No. 10/157,892 filed on May 31, 2002 entitled "CONTROLLED COOLING OF A DATA CENTER", by Patel et al.; U.S. application Ser. No. 10/122,010, filed on Apr. 24, 2002, and entitled, "DATA CENTER ENERGY MANAGEMENT SYSTEM", by Friedrich et al.; and pending U.S. application Ser. No. 09/843,933, filed Apr. 30, 2001, and entitled "MULTI-LOAD THERMAL REGULATING SYSTEM WITH MULTIPLE SERIAL EVAPORATORS", by Beitelmal et al., all of which are assigned to the assignee of the present invention and are incorporated by reference herein in their entireties.

FIELD OF THE INVENTION

This invention relates generally to cooling systems.

BACKGROUND OF THE INVENTION

A data center may be defined as a location, e.g., room, that houses computer systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, cooling fluid, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically require a minimum of about thirty (30) percent of the required operating energy to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center may only utilize around 30–50% of the maximum cooling capacity. In this respect, conventional cooling systems often attempt to cool components that may not be operating at a level which may cause their temperatures to exceed a predetermined temperature range. Consequently, conventional cooling systems often incur greater amounts of operating expenses than may be necessary to sufficiently cool the heat generating components contained in the racks of data centers.

Moreover, the future of data center cooling will involve many small (1,000 to 2,000 sq. ft.) and readily deployable data centers that are akin to portable buildings or shipping containers. Current cooling systems, such as chilled water units, are relatively time-consuming to install and difficult to use in such compact data centers.

SUMMARY OF THE INVENTION

According to one embodiment, the present invention pertains to a method for cooling a room configured to house a plurality of computer systems. In the method, there is provided a plurality of evaporator units that are distributed in series and that are configured to receive air from the room and to deliver air to the room. The plurality of evaporator units are supplied with refrigerant, wherein the refrigerant is operable to cool the received air in the plurality of evaporator units. Temperatures are sensed at one or more locations in the room, and at least one of the temperature of the refrigerant and the air delivery to the room is controlled in response to the sensed temperatures at the one or more locations.

According to another embodiment, the invention relates to a system for cooling a room containing one or more computer systems. The system includes a plurality of evaporator units that are distributed in series and that are configured to receive refrigerant through a refrigerant line and to receive air. The air may be cooled through heat transfer with the refrigerant and the plurality of evaporator units have at least one fan configured to cause air to flow out of the plurality of evaporator units. An evaporator controller is operable to control a supply of the refrigerant to the plurality of evaporator units and operable to control the speed of the at least one fan. A refrigeration system is provided for cooling the refrigerant, and a refrigeration system controller is configured to operate the refrigeration system to vary the temperature of the refrigerant.

According to yet another embodiment, the present invention pertains to a system for cooling computer systems housed in one or more racks that are maintained in a room. The system includes means for cooling air that includes a plurality of evaporators distributed in series and further includes means for receiving refrigerant. The system also includes means for delivering cooled air to the computer systems, and means for measuring temperatures at one or more locations in the room. Additionally, the system includes means for controlling delivery of the cooled air in response to the temperature measurements, wherein the means for controlling delivery includes means for independently adjusting the flow of refrigerant through at least one of the plurality of evaporators. Finally, the system includes means for controlling the temperature of the refrigerant.

According to still another embodiment, the present invention pertains to computer readable storage medium on which is embedded one or more computer programs that implement a method of cooling a room configured to house a plurality of computer systems. The one or more computer programs include a set of instructions for providing a plurality of evaporator units that are distributed in series and that are configured to receive air from the room and to deliver air to the room. The plurality of evaporator units are supplied with refrigerant, wherein the refrigerant is operable to cool the received air in the plurality of evaporator units. Temperatures are sensed at one or more locations in the room, and at least one of the temperature of the refrigerant and the air delivery to the room is controlled in response to the sensed temperatures at the one or more locations.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1:
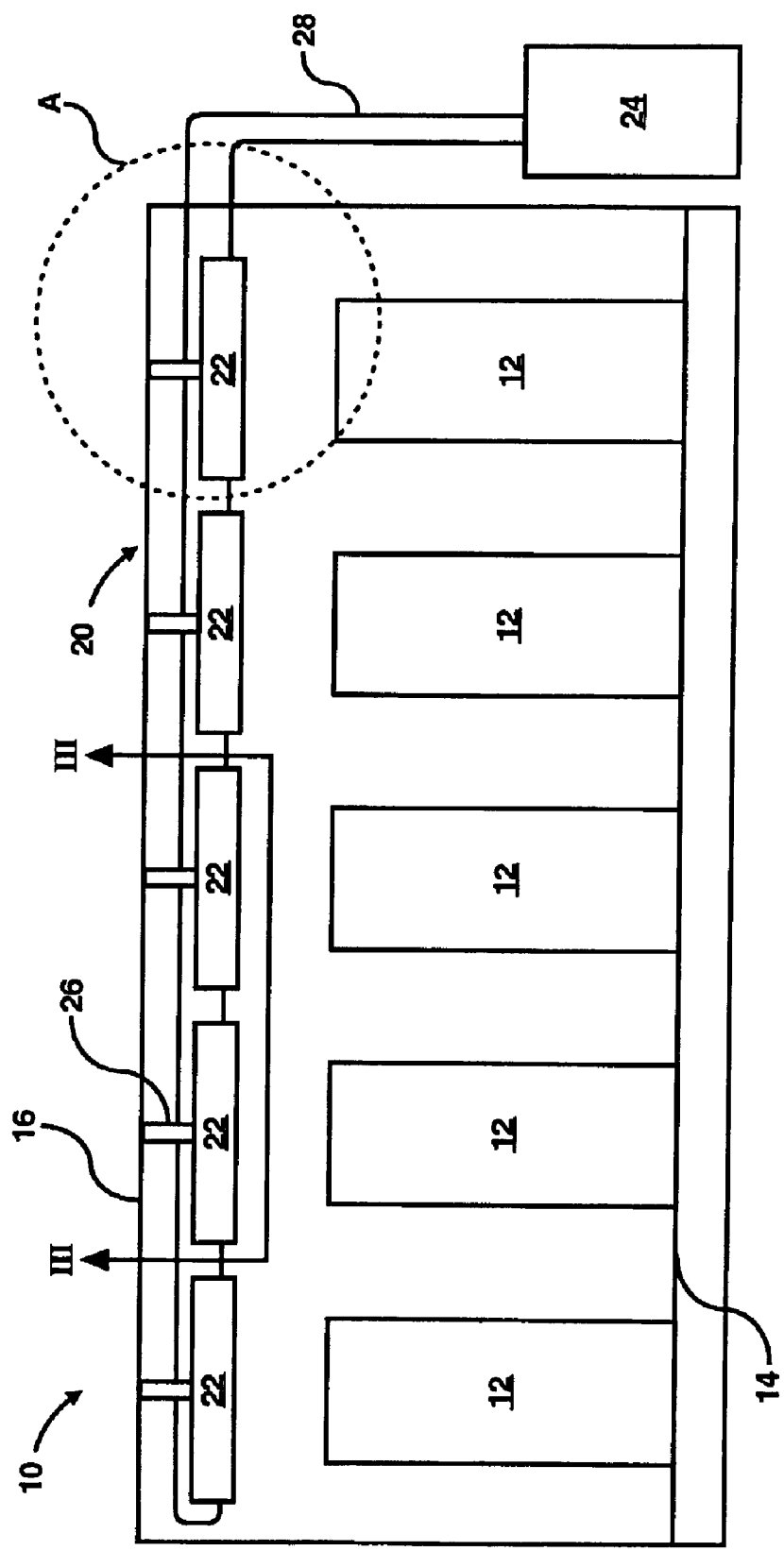
FIG. 1 shows a simplified schematic illustration of a room containing a cooling system in accordance with an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to an embodiment of the present invention, a cooling system may include a heat exchanger unit (HEU) configured to receive cooling fluid (e.g., chilled water, R134a, ethylene glycol mixture, and the like). The HEU may be designed to cause air to exchange heat with the cooling fluid to thereby cool the air. The HEU may also be designed to deliver the cooled air to one or more computer systems. The cooling system may also include a cooling device operable to cool the cooling fluid. The cooling device may comprise one or more of known cooling systems (e.g., a closed loop refrigeration cycle configured to transfer heat with the cooling fluid). The cooling device may therefore include a second generally closed-loop system having refrigerant flowing through a refrigerant line and positioned to receive heat from the cooling fluid.

One or more controllers may be provided to operate the cooling system components. The one or more controllers may be configured to monitor environmental conditions within the room, and more particularly in areas around predetermined computer systems, and manipulate operation of the HEU and the cooling device according to the monitored environmental conditions. For example, the one or more controllers may control the temperature of the cooling fluid and/or the output of the HEU.

In one respect, by manipulating the output of the HEU and the temperature of the cooling fluid, the amount of energy required to cool the computer systems may be relatively low. Thus, according to the embodiment described above, instead of operating components of the cooling device, e.g., compressors, heat exchangers, fans, etc., at substantially 100 percent of the anticipated heat dissipation from the computer systems, those components may be operated according to the actual cooling needs. In addition, the computer systems and the racks in which they are housed may be positioned throughout the room according to their anticipated heat loads, to additionally increase control over the energy required by the cooling system. Furthermore, as described in U.S. application Ser. No. 10/122,010, filed on Apr. 24, 2002, the loads may be distributed between various computer systems to further increase energy efficiency of air conditioning resources.

In another respect, the positioning of the racks may be determined through implementation of numerical modeling and metrology of the cooling fluid flow throughout the data center. In addition, the numerical modeling may be implemented to determine the volume flow rate and velocity of the cooling fluid flow through each of the HEU's.

A more detailed description of the above-described embodiment may be found in co-pending U.S. application Ser. No. 09/970,707, filed Oct. 5, 2001, which is assigned to the assignee of the present invention and is incorporated by reference herein in its entirety.

Referring first to FIG. 1, there is illustrated a room 10, e.g., a data center, housing a plurality of racks 12, and a cooling system 20. Also illustrated is a raised floor 14 that may be provided to enable placement of wires, tubes, and the like for delivery into and from the racks 12.

The racks 12 may generally house a plurality of components (not shown), e.g., processors, micro-controllers, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, may dissipate relatively large amounts of heat. Because the racks 12 have been generally known to include upwards of forty (40) or more subsystems, they may require substantially large amounts of cooling fluid to maintain the subsystems and the components generally within a predetermined operating temperature range. According to an embodiment of the invention, by substantially controlling the amount of cooling air delivered to the components and the subsystems located in the racks 12 based upon their respective heat loads, the power consumed by the cooling system 20 to cool and supply the cooling fluid may also be controlled.

The cooling system 20 is illustrated as including a plurality of HEU's 22 and a cooling device 24. The HEU's 22 may be supported from a ceiling 16 of the room 10 by one or more supports 26. The HEU's 22 may comprise any reasonably suitable air conditioning unit designed to receive air and to deliver the received air, e.g., the DATACOOL environmental control system manufactured and distributed by Liebert of Irvine, California. As can be seen in FIG. 1, the HEU's 22 are positioned to receive air that may become heated by virtue of the heat dissipated by, for example, the computer systems located in the racks 12. Although an HEU 22 is illustrated as positioned over a rack 12, it should be understood that the HEU's 22 may be positioned at various other locations. For example a plurality of HEU's 22 may be positioned to cool a single rack. Determinations of HEU 22 placement within the room 10 may be predicated upon techniques designed to optimize cooling performance and/or energy efficiency.

The HEU's 22 may be positioned to generally supply the racks 12 with cooling air. More particularly, the HEU's 22 may be positioned to supply cooling air to the racks 12 in accordance with their heat dissipation. By way of example, computer systems that undergo higher loads are known to generate greater amounts of heat as compared to computer systems that undergo lower or no loads. Thus, the HEU's 22 may be positioned and operated to supply those computer systems (and racks 12) that generate greater amounts of heat with greater mass flow rates of cooling air and/or relatively lower temperature air. In addition, those computer systems (and racks 12) that generate little or no heat, may likewise, receive little or no cooling air and/or relatively higher temperature air. In this respect, the amount of energy required to operate the HEU's 22 specifically, and the cooling system 20 as a whole, may be substantially optimized according to the demands of the computer systems.

Alternatively, or additionally to the above, because usage of the computer systems contained in the racks 12 may vary at different times of the day, instead of varying the position of the HEU's 22, the load placed on the computer systems may be varied. For instance, as described in co-pending U.S. application Ser. No. 10/122,010, the work load on some of the computer systems may be performed by other computer systems to substantially maximize energy efficiency of the cooling system. In this regard, the load may be transferred, for example, to one location in the room 10 if it is determined that such a load transfer is more energy efficient than under normal operating conditions. Moreover, the load transfer may occur at different times of the day and as load requirements vary.

The cooling device 24 may comprise any reasonably suitable type of cooling device designed to adequately cool the cooling fluid. In addition, the cooling device 24 may include the capability of varying the temperature of the cooling fluid. Some suitable cooling devices may include those that implement air conditioners, heat exchangers, heat pumps, variable capacity chillers, evaporative cooling systems, and the like. For example, the cooling device 24 may comprise a closed-loop refrigeration cycle apparatus having a heat transfer section where the heat from the cooling fluid in a fluid line 28 may be transferred to refrigerant contained in the closed-loop refrigeration cycle apparatus.

Although the cooling device 24 is illustrated as being located outside of the room 10, it should be understood that the cooling device 24 may be positioned within the room 24 without deviating from the scope of the present invention.

The cooling fluid may be configured to flow through the HEU's 22 and return to the cooling device 24 via fluid lines 28. As seen in FIG. 1, the fluid line 28 generally forms a closed loop system in which the cooling fluid may become heated in the HEU's 22 and cooled in the cooling device 24.

Although one room 10 is illustrated in FIG. 1, it should be understood that the room 10 may comprise more than one room and that the cooling system 20 may be configured to cool a plurality of rooms.

Figure 2:
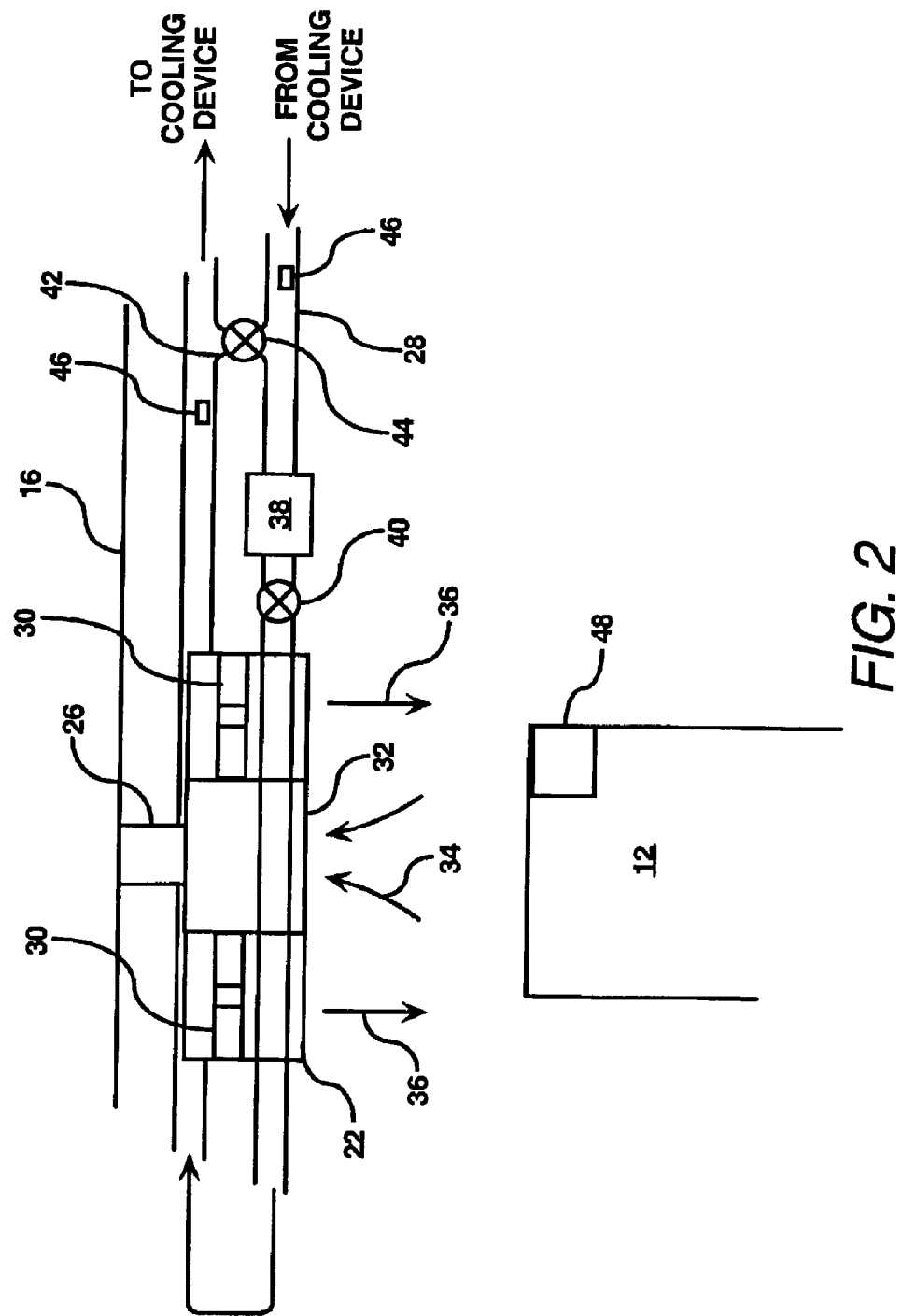
FIG. 2 is an enlarged partly cross-sectional view of section A in FIG. I.

With reference now to FIG. 2, there is illustrated an enlarged partly cross-sectional view of section A in FIG. 1. As seen in FIG. 2, the HEU 22 generally comprises, among other things, a plurality of fans 30 and an opening 32. The fans 30 are designed to cause air from the room 10 to flow into the opening 32, as indicated by arrows 34. The fans 30 are also configured to cause the air to flow back out into the room 10, in the manner indicated by arrows 36. It should be understood that the HEU 22 may include additional components and that some of the components described may be removed and/or modified without departing from the scope of the invention.

The fluid line 28 is situated to run through the HEU 22 below the fans 30 and in the direction of air flow from the HEU 22 to the room 10. In this respect, as the air flows by the fluid line 28, heat may be transferred from the air to the cooling fluid contained in the fluid line 28. Consequently, the air flowing out of the HEU 22 may be at a lower temperature relative to the air entering the HEU 22.

A pump 38 may be provided along the fluid line 28 at a location generally upstream of the HEU 22. The pump 38 may be designed to apply sufficient pressure to the cooling fluid entering the HEU 22 to enable the cooling fluid to flow at a predetermined rate through the HEU 22. In this respect, the pump 38 may comprise any pump capable of performing the above-described operations in a reasonably suitable manner. The pump 38 may be configured to supply cooling fluid to a plurality of HEU's 22 and to control the pressure of the cooling fluid flowing through one or more of the HEU's 22. A valve 40 is illustrated between the pump 38 and the HEU 22 along the fluid line 28. The valve 40 may be an electronically controllable valve capable of varying the flow of cooling fluid through the fluid line 28, as well as substantially stopping the flow of the cooling fluid. As a result, the volume flow rate of the cooling fluid through the fluid line 28 extending through the HEU 22 may be manipulated at predetermined levels such that the temperature of the air flowing out of the HEU 22 may be substantially optimized.

Although the pump 38 and the valve 40 are illustrated as separate components, it should be understood that their respective functions may be performed by a single component, e.g., the pump 38. In this example, the pump 38 may be configured as a variable speed pump configured to vary the flow of cooling fluid through the HEU 22.

A pipe 42 may be located along the fluid line 28 at a location downstream of the HEU 22. The pipe 42 may enable cooling fluid that has passed through the HEU 22 to be introduced into cooling fluid entering into the HEU 22. A pipe valve 44 may be positioned along the pipe 42 to substantially control the amount of this cooling fluid introduced into the cooling fluid entering into the HEU 22. The pipe valve 44 may be any reasonably suitable valve (e.g., a three-way valve) capable of controlling the cooling fluid flow through the pipe 42.

In this respect, the temperature of the cooling fluid may thus be further controlled. By way of example, the temperature of the cooling fluid may be increased prior to its introduction into an HEU 22 in a multi-HEU system (see e.g., FIG. 3). In this type of configuration, when one rack 12 is dissipating a greater amount of heat relative to another rack 12, the temperature of cooling air flow supplied to each of these racks may differ from one another. That is, the rack 12 dissipating the greater amount of heat may receive air flow from a first HEU 22 that is at a lower temperature compared to the rack that is dissipating a lesser amount of heat. Consequently, the temperature of the cooling fluid introduced into that first HEU may be at a lower temperature than the cooling fluid introduced into a second HEU.

Temperature sensors 46 may be located in a supply portion and a return portion of the fluid line 28 such that a determination may be made as to changes in the cooling fluid temperature prior to and following flow through the HEU 22. This information may be implemented to determine the amount of return cooling fluid to be introduced into the supply portion of the fluid line 28.

A temperature sensor 48 e.g., a thermocouple or the like, is illustrated on the rack 12. A single temperature sensor 48 is depicted in FIG. 2 for purposes of simplicity, it should, however, be understood that a plurality of temperature sensors 48 may be positioned at various locations of the rack 12 as well as other areas of the room 12. The temperature sensor 48 may supply temperature readings to a controller (not shown) configured to operate the HEU 22, the pump 38, the valve 40, and the pipe valve 44. In addition, the temperature readings may also be supplied to a controller (not shown) configured to operate the cooling device 24. The manner of information transmittal between the temperature sensor 48 and the controllers may comprise any reasonably suitable arrangement, e.g., wired or wireless connection.

In place of, or in addition to, the temperature sensor 48, a mobile device (not shown) designed to gather or measure at least one local environmental condition (e.g., temperature, air flow, humidity, etc.) in the room 10 may be implemented. By way of example, a suitable mobile device may comprise the environmental condition detecting device described in co-pending U.S. application Ser. No. 10/157,892, filed on May 31, 2002 entitled "CONTROLLED COOLING OF A DATA CENTER", by Patel et al., which is assigned to the assignee of the present invention and incorporated by reference herein in its entirety. Information gathered by the mobile device may be transmitted to the controller, which may vary operation of the cooling system 20 in response to the information.

Alternatively, or in addition to, the above-described environmental condition sensing devices, the amount of heat generated by the computer systems contained in the racks 12, and the resulting necessary cooling requirements, may be anticipated according to the amount of load placed on the computer systems. A suitable method of implementing anticipated sensing is described in co-pending U.S. application Ser. No. 09/970,707, which is assigned to the assignee of the present invention and incorporated by reference herein in its entirety.

Figure 3:
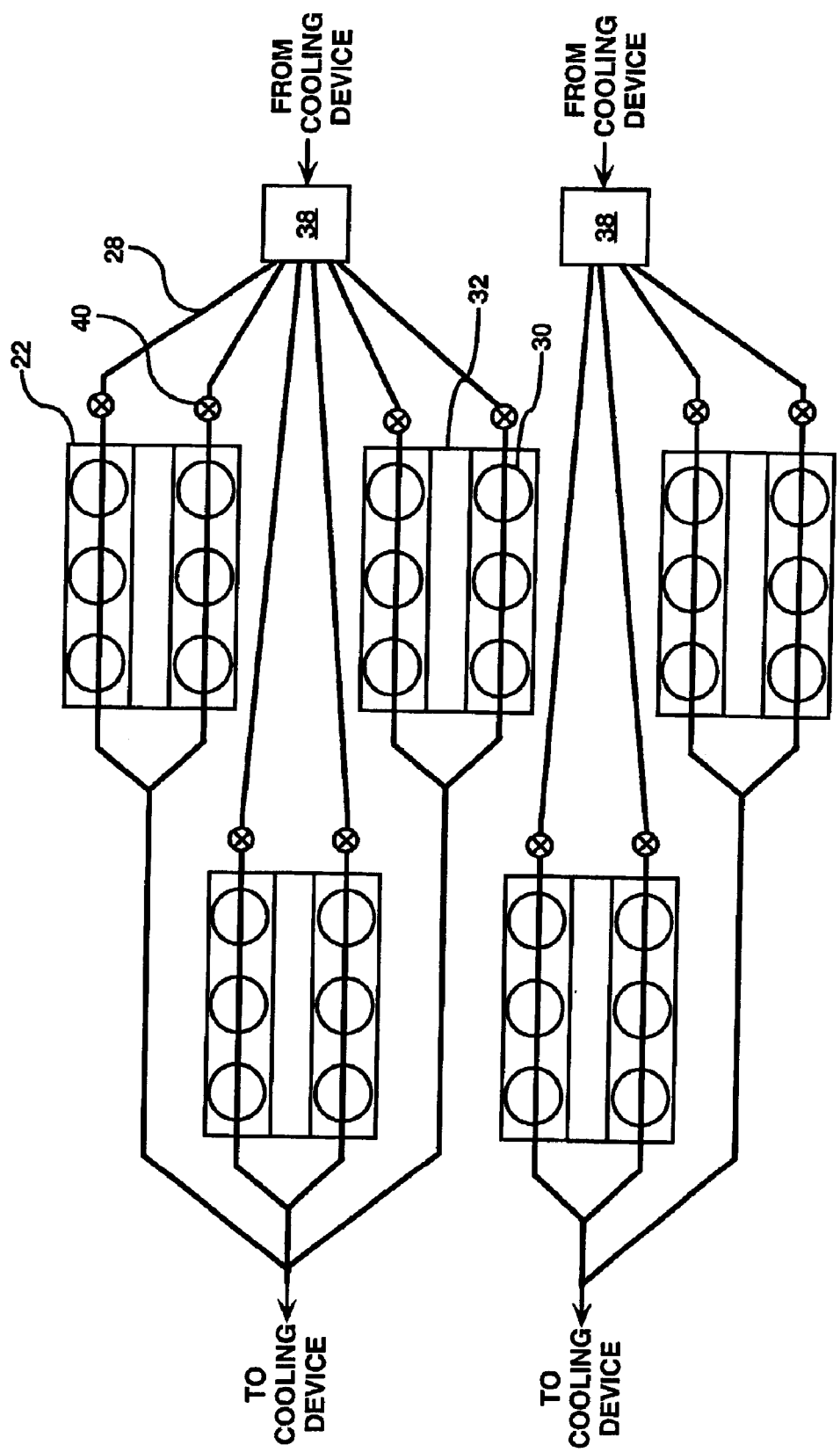
FIG. 3 is a schematic illustration taken along lines III—III of FIG. 1.

Referring now to FIG. 3, there is shown a schematic illustration taken along lines III—III of FIG. 1. FIG. 3 illustrates a plurality of HEU's 22 and a plurality of fluid lines 28 emanating from a pair of pumps 38. The illustration also shows that the HEU's 22 include rows of fans 30 located adjacent to the openings 32. Situated beneath each of the fans 30 are fluid lines 28. In addition, located generally upstream of the HEU's 22 are respective valves 40, which may comprise three-way valves. As can be seen in FIG. 3, the pumps 38 may control the supply of cooling fluid through a plurality of HEU's 22. In addition, it may be seen that the valves 40 generally enable control of cooling fluid flow through respective fluid lines 28.

In this respect, the temperature of the air flowing out of the HEU's 22, and more specifically, out of each side of the HEU's 22 may be controlled in substantially independent manners (e.g., by operation a three-way valves (not shown)). In one regard, the flow of cooling fluid through certain HEU's 22 may be restricted or substantially halted, for instance, in situations where the computer systems for which an HEU 22 is configured to cool are in idle states. It should be understood that the configuration of HEU's 22, pumps 38, fluid lines 28, and valves 40 depicted in FIG. 3 is but one manner of a variety of different obtainable configurations. It should also be understood that the specific configuration for any given room may depend upon a multitude of factors, e.g., cooling needs, room configuration, cooling device type, etc. In addition, the fluid lines 28 may be positioned above the fans 30 such that air may substantially be cooled prior to flowing into the fans 30 without deviating from the scope of the present invention.

Figure 4:
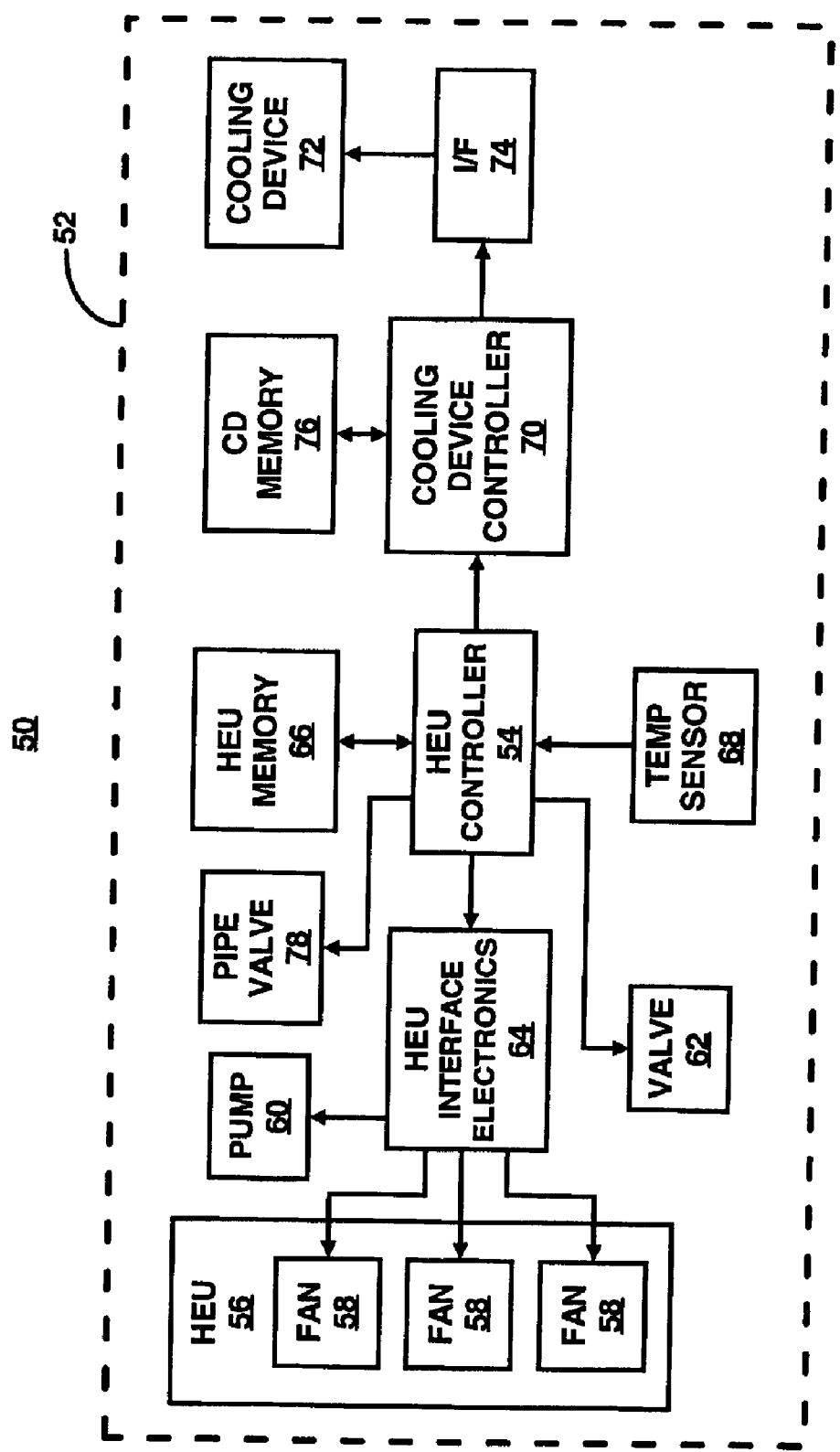
FIG. 4 is an exemplary block diagram for a cooling system according to an embodiment of the invention.

FIG. 4 is an exemplary block diagram 50 for a cooling system 52 according to an embodiment of the invention. It should be understood that the following description of the block diagram 50 is but one manner of a variety of different manners in which such a cooling system 52 may be operated. In addition, it should be understood that the cooling system 52 may include additional components and that some of the components described may be removed and/or modified without departing from the scope of the invention.

The cooling system 52 includes an HEU controller 54 configured to control the operations of the HEU 56. The HEU controller 54 may comprise a microprocessor, a microcontroller, an application specific integrated circuit (ASIC), and the like. The HEU controller 54 may, for example, control the speed of the fans 58, the operation of the pump 60, the valve 62, and the pipe valve 78. Interface electronics 64 may be provided to act as a control interface between the HEU controller 54 and the HEU 56, pump 60, and valve 62. Alternatively, a control interface my be omitted between the HEU controller 54 and the above-described components as seen with respect to the connection between the HEU controller 54 and, for example, the pipe valve 78. The HEU controller 54 may also be interfaced with a temperature sensor 68, e.g., one or more of the temperature sensors described hereinabove with respect to FIG. 2.

The HEU controller 54 may be interfaced with an HEU memory 66 configured to provide storage of a computer software that provides the functionality of the HEU controller 54, e.g., the speed of the fans, pump operation, etc. The HEU memory 66 may be implemented as a combination of volatile and non-volatile memory, such as dynamic random access memory (DRAM), EEPROM, flash memory, and the like. The HEU memory 66 may also be configured to provide a storage for containing data and/or information pertaining to the manner in which HEU controller 54 may operate the fans 58, the pump 60, the valve 62, and the pipe valve 78. In one respect, the manner of operation of the above-described components may be based according to temperature measurements by the temperature sensor 68.

The HEU controller 54 may be further interfaced with a cooling device controller 70. The interface may be effectuated via a wired protocol, such as IEEE 802.3, etc., wireless protocols, such as IEEE 801.11b, wireless serial connection, Bluetooth, etc., or combinations thereof.

The cooling device controller 70 may be configured to control the operations of the cooling device 72. The cooling device controller 70 may comprise a microprocessor, a micro-controller, an application specific integrated circuit (ASIC), and the like. The cooling device controller 70 is generally configured to manipulate the temperature of the cooling fluid by controlling the operation of the cooling device 72. In this regard, the cooling device 72 may comprise a variable speed compressor, a heat exchanger, a chilled water heat exchanger, a centrifugal chiller, and the like. More particularly, the cooling device controller 70 may be designed to vary the operation of one or more of the above-recited components to vary the amount of heat transfer on the refrigerant contained in the refrigeration loop of the cooling device 72 to thereby vary the cooling fluid temperature.

Interface electronics (I/F) 74 may be provided to act as an interface between the cooling device controller 70 and the components for operating the cooling device 72, e.g., the supply of voltage to vary the speed of the compressor, control of the heat exchanger (centrifugal chiller) capacity, etc.

The cooling device controller 70 may also be interfaced with a cooling device (CD) memory 76 configured to provide storage of a computer software that provides the functionality of the cooling device 72, e.g., compressor, heat exchanger, and the like, and may be executed by the cooling device controller 70. The CD memory 76 may be implemented as a combination of volatile and non-volatile memory, such as DRAM, EEPROM, flash memory, and the like. The CD memory 76 may also be configured to provide a storage for containing data/information pertaining to the manner in which the compressor (heat exchanger, chiller) may be manipulated in response to, for example, variations in the temperature of the cooling fluid and/or air in the room.

In one respect, the capacity (e.g., the amount of work exerted on the cooling fluid) of the compressor (heat exchanger, chiller, etc.) may be modified to thereby control the temperature and of the cooling fluid. The compressor (heat exchanger, chiller, etc.) may thus be controlled to either increase or decrease the mass flow rate of the refrigerant flowing therethrough. Consequently, when the temperature in the room 10 is below a predetermined range, the capacity of the (heat exchanger, chiller, etc.) may be reduced to substantially reduce the amount of work, thus the amount of energy exerted on the refrigerant. This may lead to a significant reduction in the costs associated with operating the cooling system 52 as compared with conventional cooling systems.

Because the specific type of compressor (heat exchanger, chiller, etc.) to be employed with embodiments of the invention may vary according to individual needs, the invention is not limited to any specific type of compressor (heat exchanger, chiller, etc.). Instead, any reasonably suitable type of compressor (heat exchanger, chiller, etc.) capable of accomplishing certain aspects of the invention may be employed with the embodiments of the invention. The choice of compressor (heat exchanger, chiller, etc.) may therefore depend upon a plurality of factors, e.g., cooling requirements, costs, operating expenses, etc.

By way of example, if there is a detected or anticipated change in the temperature of a rack, e.g., rack 12, areas surrounding the rack, etc., the HEU controller 54 may operate to manipulate the corresponding HEU 56 and/or fan(s) 58 to compensate, e.g., change the volume flow rate, velocity, and other characteristic of the air flow, for the change in temperature. In addition, or as an alternative to the above, the cooling device controller 70 may operate to cause the cooling device 72 to lower the refrigerant temperature. In this respect, each of the racks 12 and/or portions thereof may generally receive substantially only the amount of cooling air necessary to maintain the temperature of the racks 12 within a predetermined temperature range. In addition, the refrigerant, and therefore the cooling fluid, temperature may also be controlled as needed to substantially optimize cooling of the racks 12. By controlling the cooling air flow in the above-described manner, the cooling system 52 may be operated at substantially optimized levels, thereby decreasing the amount of energy and thus the operating costs required to cool the computer systems in the racks 12.

Moreover, the cooling device controller 70 may operate the compressor (heat exchanger, chiller, etc.) in a manner to vary the cooling fluid temperature in response to various degrees of detected increases/decreases in the operation of the HEU 56. More particularly, a look up table (not shown) may be stored in the CD memory 76. The look up table may include information pertaining to the level of compressor speed (heat exchanger capacity, etc.) increase necessary for a detected increase in the operation of the HEU 56. In this respect, the compressor speed (heat exchanger capacity, etc.) may be varied substantially incrementally in response to detected changes in the operation of the HEU 56.

Figure 5:
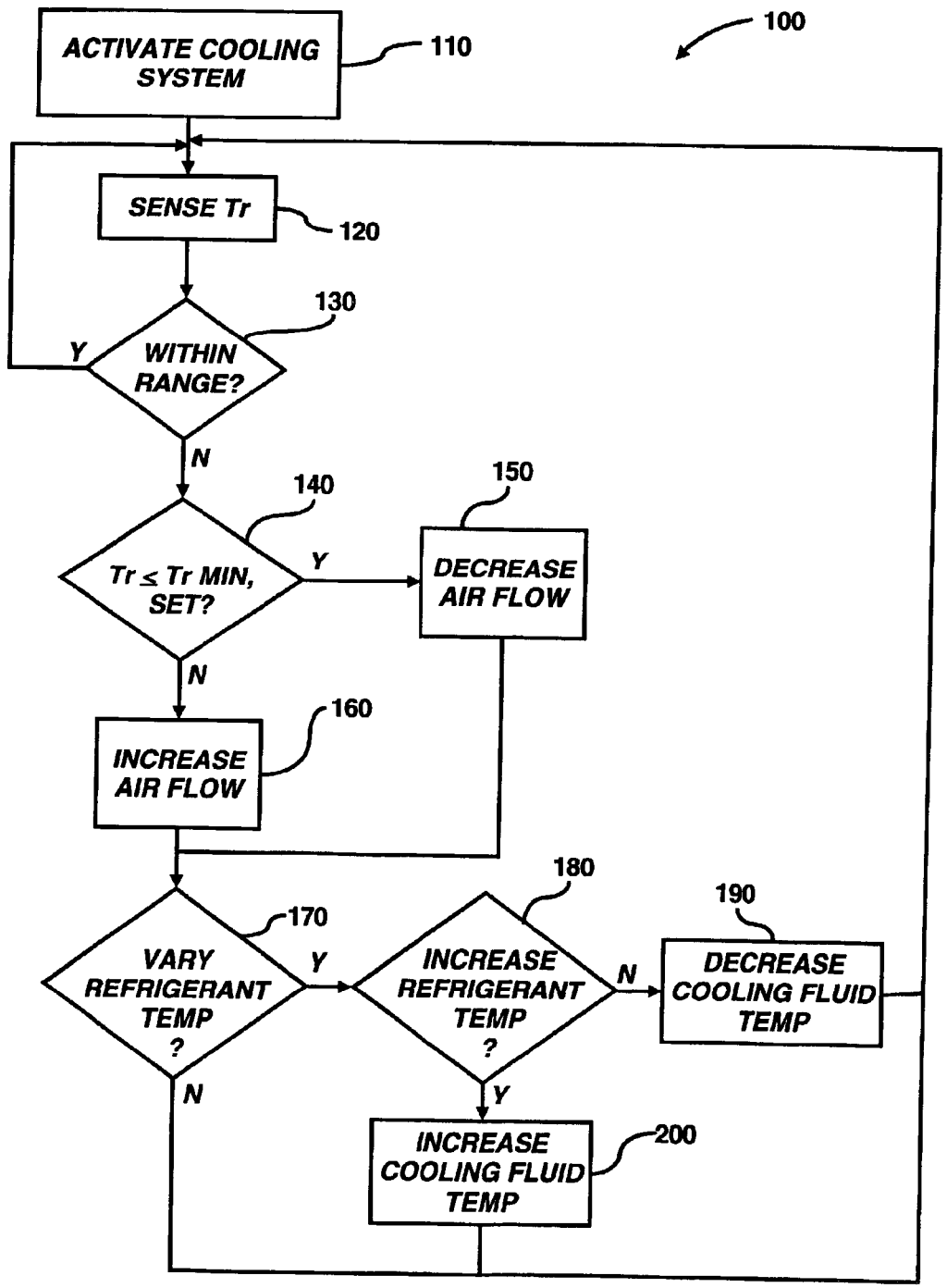
FIG. 5 shows a flow diagram of an operational mode according to an embodiment of the invention.

FIG. 5 shows a flow diagram of an operational mode 100 according to an embodiment of the invention. It should be understood that the operational mode 100 may include additional operations and that some of the operations may be removed and/or modified without departing from the scope of the invention. The following description of the operational mode 100 is made with reference to the block diagram 50 illustrated in FIG. 4, and thus makes reference to the elements cited therein.

The operations illustrated in the operational mode 100 may be contained as a utility, program, or a subprogram, in any desired computer accessible medium. In addition, the operational mode 100 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the operational mode 100, the cooling system 52 is activated at step 110. At step 120, the temperature of one or more racks (Tr) is sensed by temperature sensors, e.g., one or more temperature sensors 68. The temperature sensors may comprise one or more of the above-described temperature sensors, e.g., thermocouple, mobile environmental condition sensing device, etc. The Tr's generally correspond to the heat load of the heat dissipating components and therefore the computer systems contained in the racks, e.g., rack 12. Therefore, the Tr's may be based upon the temperatures of specific heat dissipating components and subsystems. In addition, the Tr's may be based upon the temperatures in the general vicinity of the racks and/or sections of the racks. Thus, those skilled in the art will understand that certain embodiments of the present invention may be employed with temperature sensors located at various positions throughout the room, e.g., room 10. Moreover, use of the term "rack" herein generally refers to racks for supporting computer systems and additionally to sections of the racks as well as areas around the racks. Therefore, the use of the term "rack" throughout the present disclosure is not meant to limit certain aspects thereof to entire racks, but instead, is relied upon to simplify the description of certain embodiments of the present invention.

As an alternative to the temperature sensor 68, the Tr's may be anticipated in the manner described hereinabove and in co-pending U.S. patent application Ser. No. 09/970,707.

At step 130, it is determined whether each of the Tr's is within a predetermined range of operating temperatures, e.g., between a maximum set point temperature (Tmax,set) and a minimum set point temperature (Tmin,set). In general, the range of temperatures Tmin,set and Tmax,set pertains to threshold temperatures to determine whether to increase or decrease the flow of cooling air delivered to the racks. This range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another.

For those racks having Tr's that are within the predetermined range, their temperatures are sensed again at step 120. For those racks determined to have heat loads that do not fall within the predetermined temperature range, i.e., fall outside of Tmin,set and Tmax,set, the HEU controller 54 may determine whether those racks have temperatures that are below the Tmin,set at step 140.

The air flow supplied by the HEU 56, and more particularly the fans 58, configured to supply cooling air flow to the racks having Tr's below or equal to the Tmin,set, may be decreased at step 150. In addition, and/or alternatively, the temperature of the cooling fluid supplied through the HEU's 56 may be increased to thereby increase the temperature of the air supplied to these racks. As described hereinabove, this may be accomplished by decreasing the work placed on the refrigerant by the cooling device 72 and/or by opening the bypass valve 62. Additionally, the temperature of the air flowing from the HEU 56 may also be increased by causing the valve 78 to enable a lower volume flow rate of cooling fluid to flow therethrough.

The air flow supplied by the HEU 56 configured to supply cooling air flow to the racks having Tr's above the Tmin,set, and thus above the Tmax,set, may be increased at step 160. In this regard, the HEU controller 54 may increase power to the fans 58 to enable greater air flow to the racks. In addition, and/or alternatively, the HEU controller 54 may increase the flow of cooling fluid through the HEU 56 via operation of the pump 60 and/or the valve 78.

By virtue of certain embodiments of the invention, racks having various Tr's may be supplied with air flow having various characteristics, e.g., temperature, velocity, direction, and the like. That is, for example, in a system comprising a plurality of HEU's 56, air flow may be supplied to racks having higher Tr's by certain HEU's 56 substantially simultaneously with air flow supplied to racks having relatively lower Tr's by other HEU's 56 where each of the racks receives different levels of air flow. Additionally, the temperature of the cooling fluid supplied through the HEU's 56 delivering air flow to racks having higher Tr's may be relatively lower than the temperature of the cooling fluid supplied through the HEU's 56 delivering air flow to racks having lower Tr's. It should thus be appreciated that steps 150 and 160 may be respectively and substantially simultaneously performed by various HEU's 56.

According to an embodiment of the invention, the decrease in volume flow rate and/or velocity of the air flow at step 150 and the increase in volume and/or velocity of the air flow at step 160 may be accomplished by incrementally varying the air flow from the HEU 56. For example, the volume flow rate and/or velocity of the air flow from the HEU 56 may be varied by a predetermined amount during a first iteration. The Tr may be measured at a predetermined time following the variation and steps 130–160 may be repeated. By repeating this process a number of times, the temperature of the rack may be substantially brought within the predetermined range.

At step 170, the cooling device controller 70 may determine whether to vary the cooling fluid temperature, e.g., increase the compressor speed (or heat exchanger capacity, etc.). The cooling fluid temperature may be decreased in response to, for example, actual and/or detected increases in Tr. In the alternative, the decrease in cooling fluid temperature may be predicated upon the amount of work performed by the HEU 56. More particularly, as the work performed by the HEU 56 increases, thereby signaling an increase in the Tr, the cooling device controller 70 may cause the cooling device 72 to decrease the refrigerant temperature. In addition, when a plurality of HEU's 56 are implemented to cool one or more racks, the cooling device controller 70 may determine whether the total amount of decreases in the volume flow rates of the cooling air exceeds the total amount of increases in the volume flow rates flow of the cooling air. At step 180, the cooling device controller 70 may determine whether to decrease the cooling fluid temperature.

At step 190, the cooling device controller 70 may cause the cooling fluid temperature to be decreased in response to a determination to do so at step 180. Alternatively, the cooling device controller 70 may cause the cooling fluid temperature to be increased at step 200 in response to a determination to do so at step 180. As described hereinabove, the cooling device controller 70 may operate to vary the temperature of the cooling fluid by varying the speed of the compressor, capacity of the heat exchanger, and the like.

It should be understood that steps 150, 160, and 190 or 200 may be performed substantially simultaneously. More particularly, on a zonal level, temperature readings determined at step 120 for various racks may be implemented in varying the delivery of cooling air to the various racks. Additionally, on a global level, the temperature of the cooling fluid may be varied according to the changes in the cooling requirements of the racks. For example, when the temperature of a rack exceeds a predetermined threshold range, the HEU(s) 56 supplying cooling air flow to that rack may increase the air flow to that rack. Substantially concurrently, the temperature of the cooling fluid may be decreased by an amount relative to the increased rack temperature.

Following steps 190 or 200, the Tr's are sensed again at step 120. In addition, the steps following step 120 may be repeated for an indefinite period of time and may form a closed-loop pattern.

Figure 6:
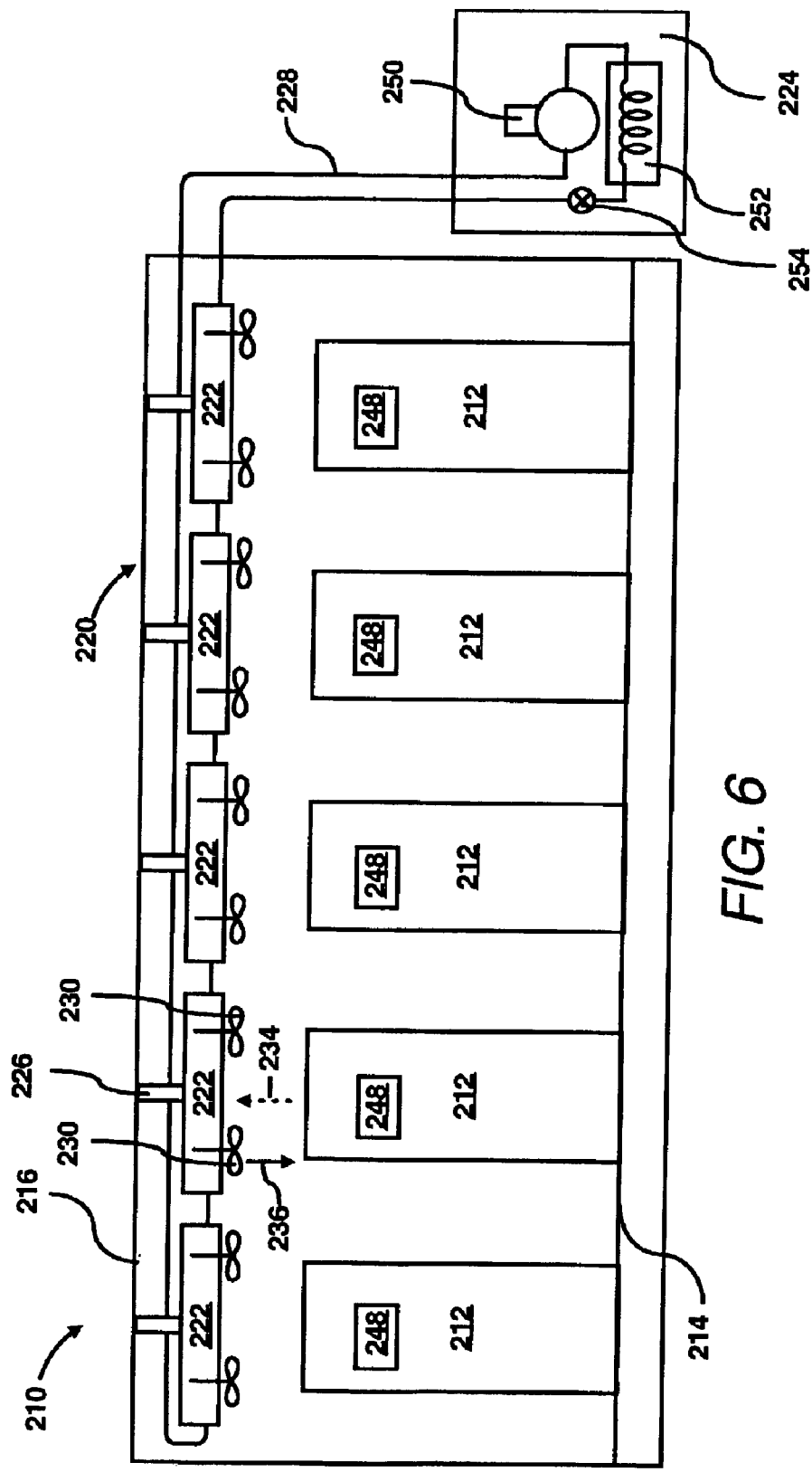
FIG. 6 shows a simplified schematic illustration of a room containing a cooling system in accordance with another embodiment of the invention.

Referring now to FIG. 6, there is illustrated a room 210, e.g., a data center, housing a plurality of racks 212, and a multi-load thermal regulating system or cooling system 220. Also illustrated is a raised floor 214 that may be provided to enable placement of wires, tubes, and the like for delivery into and from the racks 212.

The racks 212 may generally house a plurality of components (not shown), e.g., processors, micro-controllers, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, may dissipate relatively large amounts of heat. Because the racks 212 have been generally known to include upwards of forty (40) or more subsystems, they may require substantially large amounts of cooling fluid (e.g. air) to maintain the subsystems and the components generally within a predetermined operating temperature range. According to an embodiment of the invention, by substantially controlling the amount of cooling air delivered to the components and the subsystems located in the racks 212 based upon their respective heat loads, the power consumed by the cooling system 220 to cool and supply the cooling fluid may also be controlled.

The cooling system 220 is illustrated as including a plurality of evaporator units or evaporators 222 that are part of a cooling apparatus or refrigeration system 224. The evaporators 222 may be supported from a ceiling 216 of the room 210 by one or more supports 226. The evaporators 222 may comprise any reasonably suitable combination fan-evaporator unit or can comprise a separate fan unit (not shown) and a separate evaporator (not shown). Finally, the terminology "evaporator" and "evaporator unit" are used synonymously herein and encompass the above-described variations.

As can be seen in FIG. 6, the evaporators 222 are positioned to receive air that may become heated by virtue of the heat dissipated by, for example, the computer systems located in the racks 212. Although an evaporator 222 is illustrated as positioned over a rack 212, it should be understood that the evaporators 222 may be positioned at various other locations. For example, a plurality of evaporators 222 may be positioned to cool a single rack. Determinations of evaporator 222 placements within the room 210 may be predicated upon techniques designed to optimize cooling performance and/or energy efficiency.

The evaporators 222 may be positioned to generally supply the racks 212 with cooling air. More particularly, the evaporators 222 may be positioned to supply cooling air to the racks 212 in accordance with their heat dissipation. By way of example, computer systems that undergo higher loads are known to generate greater amounts of heat as compared to computer systems that undergo lower or no loads. Thus, the evaporators 222 may be positioned and operated to supply those computer systems (and racks 212) that generate greater amounts of heat with greater mass flow rates of cooling air and/or relatively lower temperature air. In addition, those computer systems (and racks 212) that generate little or no heat, may likewise, receive little or no cooling air and/or relatively higher temperature air. In this respect, the amount of energy required to operate the evaporators 222 specifically, and the cooling system 220 as a whole, may be substantially optimized according to the demands of the computer systems.

Alternatively, or additionally to the above, because usage of the computer systems contained in the racks 212 may vary at different times of the day, instead of varying the position of the evaporators 222, the load placed on the computer systems may be varied. For instance, as described in co-pending U.S. application Ser. No. 10/122,010, the workload on some of the computer systems may be performed by other computer systems to substantially maximize energy efficiency of the cooling system. In this regard, the load may be transferred, for example, to one location in the room 210 if it is determined that such a load transfer is more energy efficient than under normal operating conditions. Moreover, the load transfer may occur at different times of the day and as load requirements vary.

The refrigeration system 224 may comprise any reasonably suitable type of refrigeration cycle including a vapor-compression cycle using a multi-phase working medium.

Although the refrigeration system 224 is illustrated as being located outside of the room 210, it should be understood that the refrigeration system 224 may be positioned within the room 210 without deviating from the scope of the present invention.

A cooling fluid, such as refrigerant, may be configured to flow through the evaporators 222 and return to the refrigeration system 224 via a fluid line 228. As seen in FIG. 6, the fluid line 228 generally forms a closed loop system in which the refrigerant may become heated in the evaporators 222 and cooled in the refrigeration system 224.

Although one room 210 is illustrated in FIG. 6, it should be understood that the room 210 may comprise more than one room and that the cooling system 220 may be configured to cool a plurality of rooms.

The evaporators 222 generally comprise, among other things, a plurality of fans 230 and an opening (not shown). The fans 230 are designed to cause air from the room 210 to flow into the opening, as indicated by dashed arrow 234. The fans 230 are also configured to cause the air to flow back out into the room 210, in the manner indicated by arrow 236. Thus, operation and speed of the fans 230 are adjusted to control air temperature and air flow rate. It should be understood that the evaporators 222 may include additional components and that some of the components described may be removed and/or modified without departing from the scope of the invention.

The fluid line 228 is situated to connect to the evaporators 222. In this respect, as liquid refrigerant flows through the fluid line 228 and into the evaporators 222, the refrigerant is expanded. In expanding, the refrigerant absorbs heat from the hot air 234 to provide refrigeration. Thus, heat may be transferred from the air to the refrigerant contained in the fluid line 228. Consequently, the air 236 flowing out of the evaporators 222 may be at a lower temperature relative to the air 234 entering the evaporators 222.

A temperature sensor 248, e.g., a thermocouple or the like, is illustrated on the rack 212. A single temperature sensor 248 is depicted in FIG. 6 for purposes of simplicity, it should, however, be understood that a plurality of temperature sensors 248 may be positioned at various locations of the rack 212 as well as other areas of the room 212. The temperature sensor 248 may supply temperature readings to a controller (not shown) configured to operate the evaporator 222, and the valve (not shown). In addition, the temperature readings may also be supplied to a controller (not shown) configured to operate the refrigeration system 224. The manner of information transmittal between the temperature sensor 248 and the controllers may comprise any reasonably suitable arrangement, e.g., wired or wireless connection.

In place of, or in addition to, the temperature sensor 248, a mobile device (not shown) designed to gather or measure at least one local environmental condition (e.g., temperature, air flow, humidity, etc.) in the room 210 may be implemented. By way of example, a suitable mobile device may comprise the environmental condition detecting device described in co-pending U.S. application Ser. No. 10/157,892, filed on May 31, 2002 entitled "CONTROLLED COOLING OF A DATA CENTER", by Patel et al., which is assigned to the assignee of the present invention and incorporated by reference herein in its entirety. Information gathered by the mobile device may be transmitted to the controller, which may vary operation of the cooling system 220 in response to the information.

Alternatively, or in addition to, the above-described environmental condition sensing devices, the amount of heat generated by the computer systems contained in the racks 212, and the resulting necessary cooling requirements, may be anticipated according to the amount of load placed on the computer systems. A suitable method of implementing anticipated sensing is described in co-pending U.S. application Ser. No. 09/970,707, which is assigned to the assignee of the present invention and incorporated by reference herein in its entirety.

Figure 7:
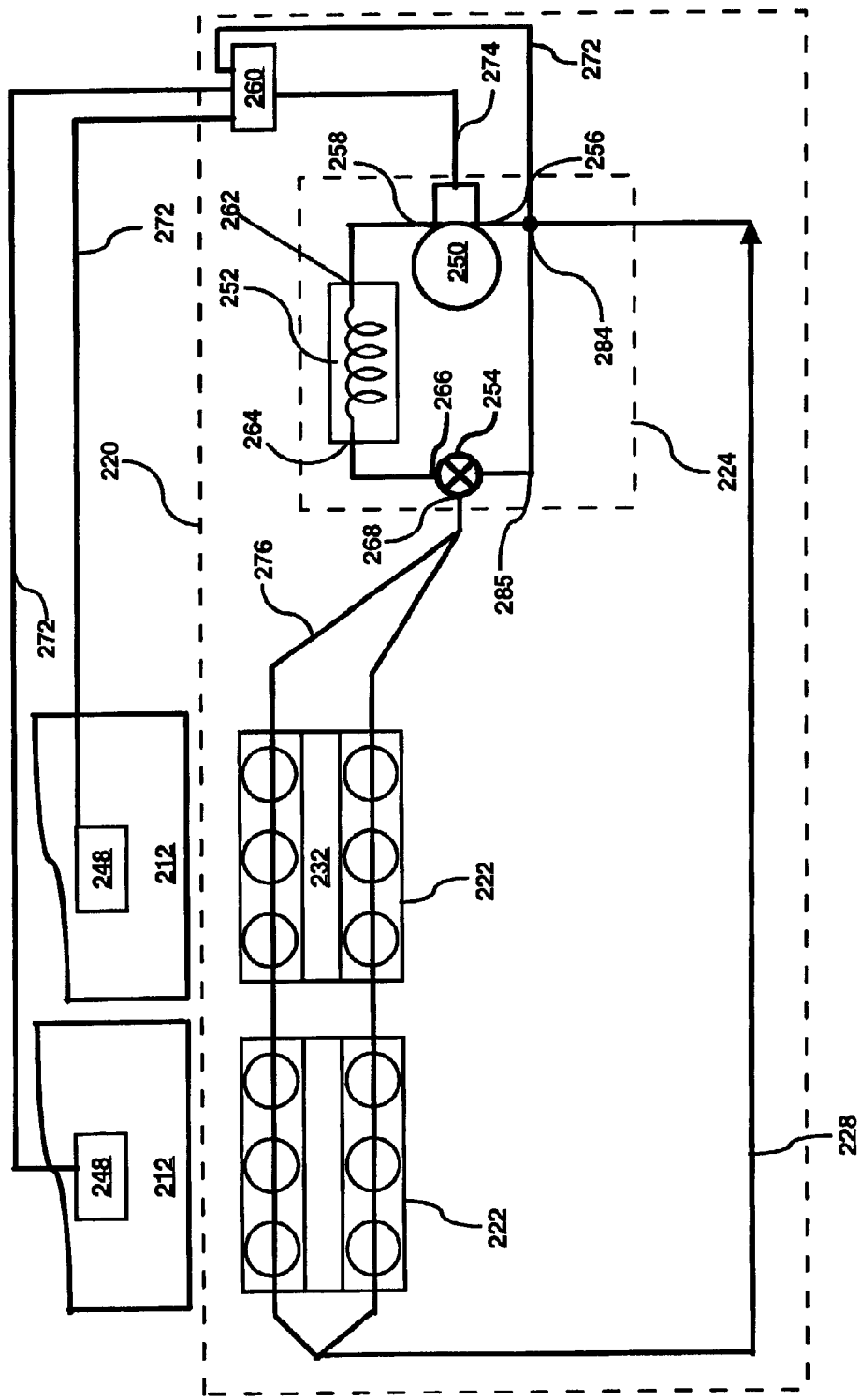
FIG. 7 is a schematic illustration of a portion of the cooling system of FIG. 6.

Referring now to FIG. 7, there is shown a schematic illustration that illustrates a plurality of evaporators 222 and a fluid line 228 emanating from the refrigeration system 224. The illustration also shows that the evaporators 222 include rows of fans 230 located adjacent to openings 232. It is contemplated that each of the evaporators 222 may include two separate evaporator units, corresponding to the separate rows of fans 230. Alternatively, it is contemplated that each of the evaporators 222 may include just a single evaporator unit corresponding to both rows of fans 230. The refrigeration system 224 may control the supply of refrigerant through the plurality of evaporators 222. It may be seen that a valve 254 generally enables control of refrigerant flow through the respective fluid line 228 to the evaporators 222, in order to control evaporator superheat. Examples of valves suitable for use with the present invention include expansion valves such as capillary tubes, constant pressure expansion valves, and the like, but it is contemplated that valve 254 is a thermal expansion valve.

In this respect, the temperature of the air flowing out of the evaporators 222, and more specifically, out of each side of the evaporators 222 may be controlled in a substantially independent manner. It should be understood that the configuration of evaporators 222 and fluid line 228 depicted in FIG. 7 is but one manner of a variety of different obtainable configurations. It should also be understood that the specific configuration for any given room may depend upon a multitude of factors, e.g., cooling needs, room configuration, refrigeration system type, etc. In addition, the fluid line 228, and/or the evaporators 222 may be positioned above or below the fans 230 such that air may substantially be cooled prior to or subsequent to flowing into the fans 230 without deviating from the scope of the present invention.

In accordance with the principles of the present invention, the temperature of a plurality of racks in a data center may be maintained within a specified temperature range while temperature variation among the racks may be reduced. In this respect, the temperature of each rack is maintained relatively constant (approximately within 5° C.) with respect to other racks, while allowing for multiple fluctuating heat loads between the racks. Excess heat is removed from each rack by a respective evaporator. That is, the present invention is configured to substantially independently maintain the temperature of each rack (or group of racks) by controlling the mass flow rate of refrigerant flowing through a series of evaporators, each evaporator (or group of evaporators) being proximate a respective rack (or group of racks).

In this respect, according to the principles of the present invention and as illustrated in FIG. 7, in a multi-load thermal regulating system or cooling system 220, multiple evaporators 222 are connected serially to one another to cool multiple racks 212 in a data center. The multi-load thermal regulating system 220, as referenced throughout the present disclosure, generally refers to a refrigeration system for cooling multiple heat loads (e.g., racks) within a predetermined range. Because the specific type of evaporator to be used in the present invention will vary according to individual needs, the present invention is not limited to any specific type of evaporator and may thus utilize any type of evaporator which may reasonably accomplish the goals of the present invention. Examples of suitable evaporators employable in the present invention are available from LYTRON, Inc. of Woburn, Mass., LIEBERT Corporation of Columbus, Ohio, and MODINE Manufacturing Company of Racine, Wis. However, as is readily apparent to those of ordinary skill in the art, any other suitable evaporators may be used in the present invention without departing from the scope and spirit of the present invention, including automotive and consumer appliance types of evaporators.

Although FIG. 7 depicts only two evaporator units, it is to be understood that the present invention is not limited to just two evaporator units, but rather, the present invention may include any reasonable number of evaporator units. In one respect, the number of evaporator units may correspond to the number of heat generating racks. Accordingly, the two evaporator units depicted in FIG. 7 are for illustrative purposes only and thus are not meant to limit the present invention in any respect. Additionally, as is well known to those having ordinary skill in the art, the term "serial" is not intended to be a limitation, but rather, with respect to the present disclosure, describes the manner in which a single conduit may be controlled as a single unit.

Additionally, any suitable type of refrigerant may be utilized in the present invention. In fact, the choice of refrigerant will depend upon a plurality of factors, e.g., cooling requirements, environmental impact, cost, etc. Generally speaking, suitable refrigerants include the suite of vapor-compression hydrocarbon refrigerants (CFCs, HCFSs, HFCs or any blend of pure refrigerants). Specific examples of suitable refrigerants include R134a, R290, R600, etc. Moreover, suitable refrigerants may be obtained from TONG TAI INTERNATIONAL located in Taiwan, R.O.C.

Referring again to FIG. 7, the multi-load thermal regulating system 220 possesses a closed loop for refrigerant to flow to and from the components of the multi-load thermal regulating system 220 (e.g., the fluid line 228, the evaporators 222, a superheat sensor 284, a compressor 250, a condenser 252, and the thermostatic expansion valve 254). Specific examples of suitable thermostatic expansion valves employable in the present invention are available from PARKER HANNIFIN CO. of Cleveland, Ohio.

According to the embodiment illustrated in FIG. 7, the compressor 250 is a variable capacity compressor. In other words, the capacity or speed of the compressor 250 may be adjusted to control refrigerant temperature and to either increase or decrease the mass flow rate of the refrigerant within the multi-load thermal regulating system 220. According to the principles of the present invention, a number of different types of variable capacity compressors may be utilized for proper operation of the present invention. Thus, in similar fashion to other types of refrigeration systems, the refrigerant flowing through the refrigerant line 228 changes between a gas and a liquid at various positions as the refrigerant circuits the closed loop of the multi-load thermal regulating system 220. Additionally, as is well known to those having ordinary skill in the art, the term "variable capacity compressor" is not intended to be a limitation, but rather, with respect to the present disclosure, describes a compressor in which the capacity may be controlled by manipulating the manner in which the compressor operates. Thus, when the operation of the variable capacity compressor is modified, the refrigerant mass flow rate may be altered in a like manner, e.g., as compressor speed is increased, mass flow rate is increased and thus increase the capacity of the refrigerant to cool a rack 212. Moreover, the speed of the compressor 250 may be varied from about 0 to about 100% and substantially any speed therebetween. However, it is within the purview of this invention that any known compressor capable of suitably varying refrigerant capacity in a controlled manner may be substituted for the variable capacity compressor without departing from the scope and spirit of the invention.

As exemplified in FIG. 7, the evaporators 222 are configured for placement near respective heat generating racks 212 by any known means which allows for adequate thermal transfer from the racks to the evaporators 222. In other words, the evaporators may be strategically placed with respect to the racks 212 to optimize heat transfer therebetween. Thus, each evaporator 222 may absorb the heat load from a respective rack 212. As used herein, the term rack encompasses a rack, a plurality of racks, and volume of air surrounding a rack or plurality of racks. Any suitable configuration of rack 212 and evaporator 222 may be utilized in the present invention. In fact, the choice of configuration will depend upon a plurality of factors, e.g., cooling requirements, design constraints, condensation control, space requirements, system optimization, cost, etc. Generally speaking, suitable configurations include those that allow heat to substantially freely move from one rack 212 to a respective evaporator 222.

In operation, the refrigerant in multiphase form (i.e., liquid and gas, and combinations thereof) flows through the series of evaporators 222 at a controlled mass flow rate. The term "controlled mass flow rate" in this context refers to the regulation of refrigerant flow through the series of evaporators 222, such that the amount of refrigerant flow is contingent upon the heat load of the racks 212.

Referring again to FIG. 7, refrigerant enters the compressor 250 through a compressor inlet 256. The compressor 250 increases the pressure and temperature of the refrigerant before the refrigerant exits through a compressor outlet 258. The compressor 250 may impart some additional heat ("WIN") on the refrigerant as the refrigerant is compressed. The speed of the compressor 250 and thus the level of compression of the refrigerant may be controlled by a proportional, integral, derivative controller with a relay ("PID") 260. Alternatively, The controller 260 may comprise a microprocessor, a micro-controller, an application specific integrated circuit (ASIC), a programmable logic controller (PLC), and the like. The manner in which the compression level is controlled by altering compressor speed will be discussed in greater detail below.

The refrigerant then flows through the refrigerant line 228 into a condenser 252 through a condenser inlet 262. The condenser 252 is capable of dissipating the heat load of the racks 212 plus WIN from the refrigerant. Within the condenser 252, in a process known to those skilled in the art, the refrigerant generally decreases in temperature. The refrigerant exits the condenser 252 through a condenser outlet 264, typically as a liquid (still at a relatively high pressure and temperature). The refrigerant then flows through the refrigerant line 228 into a thermostatic expansion valve 254 through a thermostatic expansion valve inlet 266. The thermostatic expansion valve 254 may be a regulated needle valve capable of enabling a specified refrigerant superheat to be generated within the refrigerant line 228 between the thermostatic expansion valve 254 and the superheat sensor 284. In this regard, the superheat sensor 284 may modulate the pressure of a fluid within a thermostatic control line 285 in response to a sensed refrigerant temperature such that the thermostatic expansion valve 254 may regulate the mass flow of the refrigerant in refrigerant line 228 to allow adequate superheat to be imparted on the refrigerant to ensure the refrigerant enters the compressor 250 as a gas. However, it is within the purview of this invention that any known expansion valve that suitably reduces the mass flow rate of the refrigerant fluid, thereby enabling the refrigerant fluid to absorb sufficient heat to ensure that the refrigerant is in a gaseous state upon entering the compressor at inlet 256, may be substituted for the thermostatic expansion valve 254 without departing from the scope and spirit of the invention. It is important that the refrigerant enters the compressor 250 as a gas because liquid, being incompressible, may damage the compressor 250 due to excessive pressure created by attempting to compress an incompressible fluid.

After exiting the thermostatic expansion valve 254 through a thermostatic expansion valve outlet 268, refrigerant flows through the refrigerant line 228 and enters the evaporators 222 in series. Within the first evaporator 222 the refrigerant receives (i.e., absorbs) the heat load from a respective rack 212. The refrigerant then exits the first evaporator 222 in the series, flows through a branch 276 of the refrigerant line 228, and the process is repeated for the subsequent evaporator(s) 222 in the series, whereupon the refrigerant exits the last evaporator 222 in the series, having absorbed sufficient heat load to maintain the temperature of the racks 212 within a predetermined temperature range.

Thus, in one respect, the heat load of the multi-load thermal regulating system 220 may be monitored to control compressor speed and thus the mass flow rate of refrigerant.

According to one embodiment, the temperatures of the racks 212 ("Tr") are measured by the temperature sensors 248. Although any suitable type of temperature sensor may be utilized in the present invention, examples of suitable temperature sensors include a thermocouple, thermistor, diode, temperature sensitive resistor, and the like. The temperature sensors 248 are connected to the PID 260 via input lines 272. The PID 260 is further connected to the compressor 250 via an output line 274. The PID 260 is configured to control the amount of compression the compressor 250 applies to the refrigerant based upon the measured Tr, of the racks, to thereby control the mass flow rate of the refrigerant throughout the multi-load thermal regulating system 220. Although any suitable PID 260 may be utilized with the present invention, examples of suitable PID's 260 include those manufactured by OMEGA Inc. of Stamford, Conn., and WATLOW ELECTRIC MANUFACTURING CO. of St. Louis, Mo. According to one embodiment, the temperature sensors 248 are integrated within the racks 212 or, the temperature sensors 248 may be attached to respective racks 212 by any known means which allows for thermal transfer from the racks to the temperature sensors 248. However, the temperature sensors 248 may be positioned to measure the temperature of the evaporators 222 without deviating from the scope and spirit of the present invention.

Figure 8:
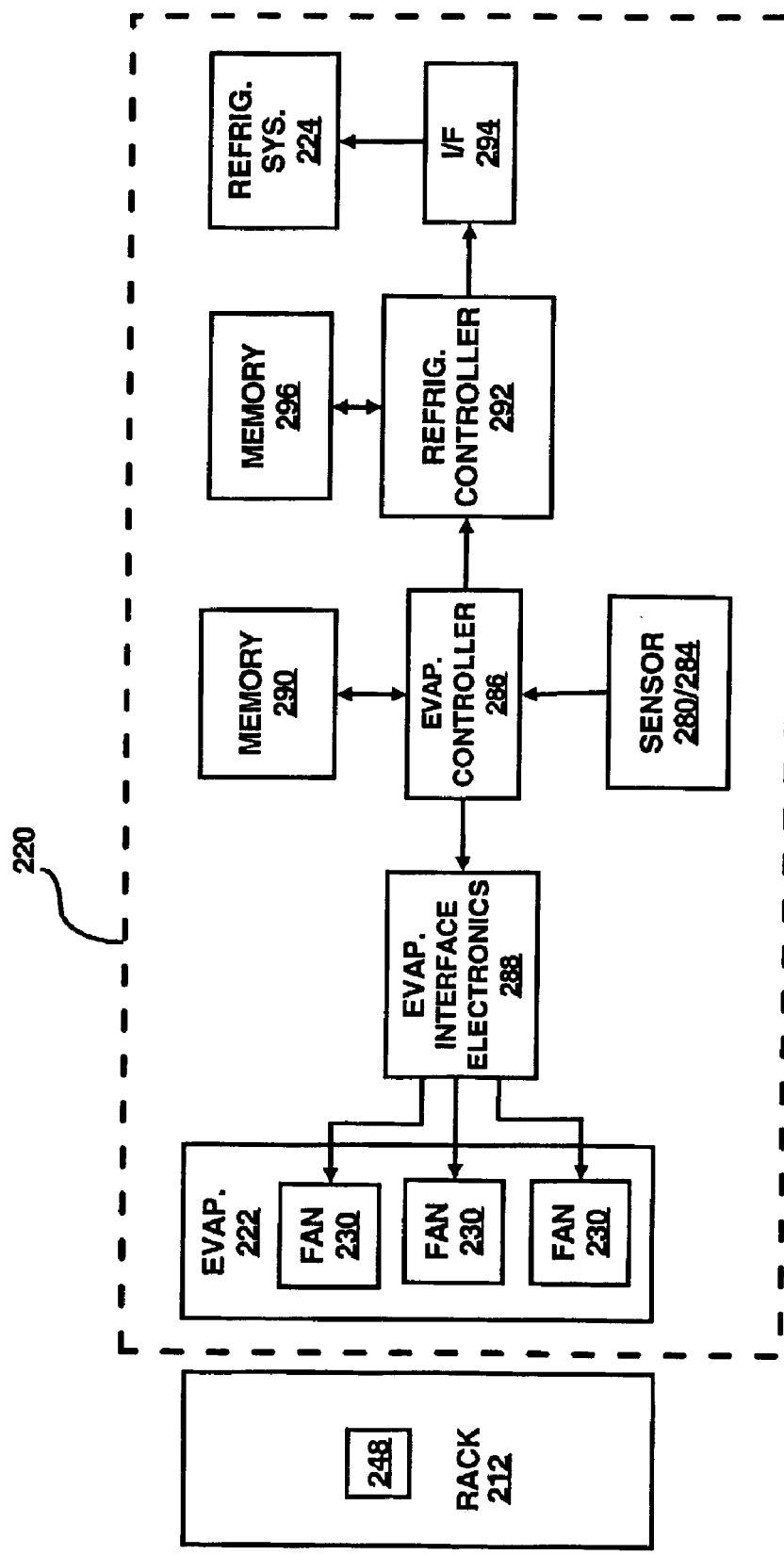
FIG. 8 is an exemplary block diagram for a cooling system according to another embodiment of the invention.

FIG. 8 is an exemplary block diagram for the cooling system 220 according to an embodiment of the invention. It should be understood that the following description of the block diagram is but one manner of a variety of different manners in which such a cooling system 220 may be operated. In addition, it should be understood that the cooling system 220 may include additional components and that some of the components described may be removed and/or modified without departing from the scope of the invention.

The cooling system 220 includes a controller 286 configured to control the operations of the evaporator 222. The controller 286 may comprise a microprocessor, a micro-controller, an application specific integrated circuit (ASIC), and the like. The controller 286 may, for example, control the power and speed of the fans 230. Interface electronics 288 may be provided to act as a control interface between the controller 286 and the evaporator 222, and fans 230. Alternatively, a control interface my be omitted between the controller 286 and the above-described components. The controller 286 may also be interfaced with a sensor 248 and/or 284, e.g., one or more of the sensors described hereinabove with respect to FIG. 7.

The controller 286 may be interfaced with a memory 290 configured to provide storage of computer software that provides the functionality of the controller 286, e.g., the speed of the fans, pump operation, etc. The evaporator memory 290 may be implemented as a combination of volatile and non-volatile memory, such as dynamic random access memory (DRAM), EEPROM, flash memory, and the like. The memory 290 may also be configured to provide a storage for containing data and/or information pertaining to the manner in which controller 286 may operate the fans 230. In one respect, the manner of operation of the above-described racks may be based according to temperature measurements by either or both sensor(s) 248 and 284.

The controller 286 may be further interfaced with a refrigeration system controller 292. The interface may be effectuated via a wired protocol, such as IEEE 802.3, etc., wireless protocols, such as IEEE 801.11b, wireless serial connection, Bluetooth, etc., or combinations thereof.

The refrigeration system controller 292 may be configured to control the operations of the refrigeration system 224. The refrigeration system controller 292 may comprise a microprocessor, a micro-controller, an application specific integrated circuit (ASIC), and the like. The refrigeration system controller 292 is generally configured to manipulate the temperature of the refrigerant by controlling the operation of the refrigeration system 224. More particularly, the refrigeration system controller 292 may be designed to vary the operation of the refrigeration system 224 to vary the amount of heat transfer on the refrigerant contained in the refrigeration loop of the refrigeration system 224. Alternatively, it is contemplated that the refrigeration system controller 292 and cooling system controller could be one integrated controller instead of two separate controllers.

Interface electronics (I/F) 294 may be provided to act as an interface between the refrigeration system controller 292 and the racks for operating the refrigeration system 224, e.g., the supply of voltage to vary the speed of the compressor, etc.

The refrigeration system controller 292 may also be interfaced with memory 296 configured to provide storage of a computer software that provides the functionality of the refrigeration system 224 and may be executed by the refrigeration system controller 292. The memory 296 may be implemented as a combination of volatile and non-volatile memory, such as DRAM, EEPROM, flash memory, and the like. The memory 296 may also be configured to provide a storage for containing data/information pertaining to the manner in which the compressor (heat exchanger, chiller) may be manipulated in response to, for example, variations in the temperature of the cooling fluid and/or air in the room.

In one respect, the capacity (e.g., the amount of work exerted on the refrigerant) of the compressor may be modified to thereby control the temperature and of the refrigerant. The compressor may thus be controlled to either increase or decrease the mass flow rate of the refrigerant flowing therethrough. Consequently, when the temperature in the room is below a predetermined range, the speed of the compressor may be reduced to substantially reduce the amount of work, thus the amount of energy exerted on the refrigerant. This may lead to a significant reduction in the costs associated with operating the cooling system as compared with conventional cooling systems.

Because the specific type of compressor to be employed with embodiments of the invention may vary according to individual needs, the invention is not limited to any specific type of compressor. Instead, any reasonably suitable type of compressor capable of accomplishing certain aspects of the invention may be employed with the embodiments of the invention. The choice of compressor may therefore depend upon a plurality of factors, e.g., cooling requirements, costs, operating expenses, etc.

By way of example, if there is a detected or anticipated change in the temperature of a rack 212, areas surrounding the rack 212, etc., the controller 286 may operate to manipulate the corresponding evaporator 222 and/or fan(s) 230 to compensate, e.g., change the volume flow rate, velocity, and other characteristic of the air flow, for the change in temperature. In addition, or as an alternative to the above, the controller 286 may operate to cause the refrigeration system 224 to lower the refrigerant temperature. In this respect, each of the racks 212 and/or portions thereof may generally receive substantially only the amount of cooling air necessary to maintain the temperature of the racks 212 within a predetermined temperature range. In addition, the refrigerant temperature, and therefore the air temperature, may also be controlled as needed to substantially optimize cooling of the racks 212. By controlling the cooling air flow in the above-described manner, the cooling system 220 may be operated at substantially optimized levels, thereby decreasing the amount of energy and thus the operating costs required to cool the computer systems in the racks 212.

Moreover, the controller 286 may operate the compressor in a manner to vary the refrigerant temperature in response to various degrees of detected increases/decreases in the operation of the evaporator 222. More particularly, a look up table (not shown) may be stored in the memory 296. The look up table may include information pertaining to the level of compressor speed increase necessary for a detected increase in the operation of the evaporator 222. In this respect, the compressor speed may be varied substantially incrementally in response to detected changes in the operation of the evaporator 222.

Figure 9:
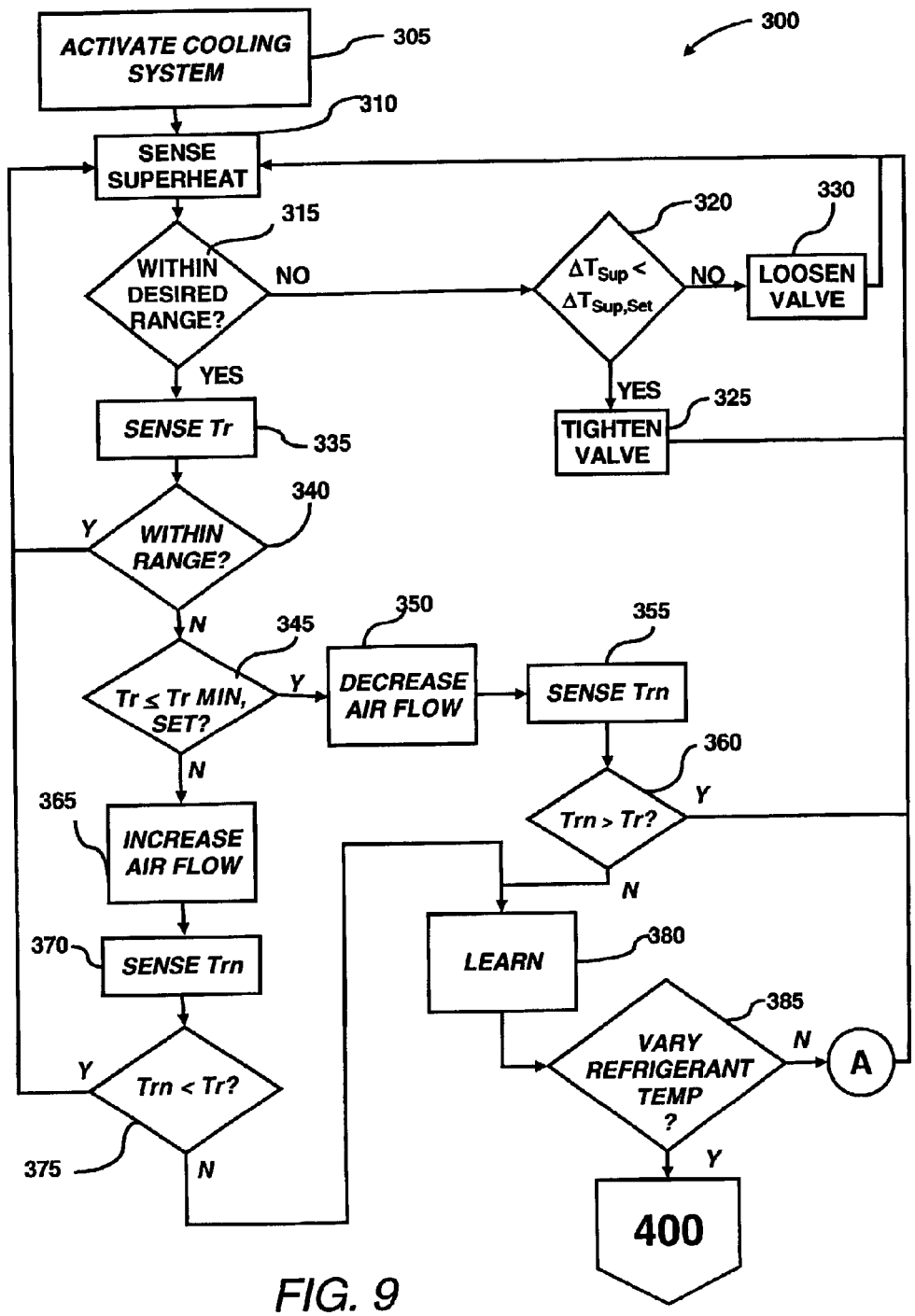
FIG. 9 shows a flow diagram of an operational mode according to another embodiment of the invention.

FIG. 9 shows a flow diagram of an operational mode 300 according to an embodiment of the invention. It should be understood that the operational mode 300 may include additional operations and that some of the operations may be removed and/or modified without departing from the scope of the invention. The following description of the operational mode 300 is made with reference to FIGS. 6–8, and thus makes reference to the elements cited therein.

The operations illustrated in the operational mode 300 may be contained as a utility, program, or a subprogram, in any desired computer accessible medium. In addition, the operational mode 300 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the operational mode 300, the cooling system 220 is activated at step 305. At step 310, the refrigerant temperature ("$\Delta T_{SUP}$") is measured by superheat sensor 284. In step 315, it is determined if the $\Delta T_{SUP}$ is within a predetermined temperature range. The predetermined temperature range is determined based upon system design and the amount of load variability expected among the racks 212. In general, the predetermined temperature range may depend upon the following factors: system application, compressor size, thermal response time of evaporators, optimization of the system, refrigerant flow rate, etc. The predetermined temperature range may be between about 0° C. and 10° C. It is contemplated that the predetermined temperature range could be between about 0° C. and 5° C., between 0° C. and 20° C., or any other reasonably suitable temperature range. If the $\Delta T_{SUP}$ is within the predetermined range, then the controller proceeds to step 335. If, however, the $\Delta T_{SUP}$ is determined to be outside of the predetermined range, the $\Delta T_{SUP}$ is compared to a predetermined set temperature ("$\Delta T_{SUP,SET}$") in step 320. If, in step 320, the $\Delta T_{SUP}$ is determined to be less than $\Delta T_{SUP,SET}$, the thermostatic expansion valve 254 is manipulated to change the flow of refrigerant through the thermostatic expansion valve 254 in step 325. If, however, in step 320, the $\Delta T_{SUP}$ is determined to be greater than or equal to the $\Delta T_{SUP,SET}$, the thermostatic expansion valve 254 is manipulated to change the flow of refrigerant through the thermostatic expansion valve 254 in step 330. After each step 325 and 330, the $\Delta T_{SUP}$ is measured again in step 310.

At step 335, the temperature of one or more racks at any given time (Tr) is sensed by temperature sensors, e.g., one or more temperature sensors 248. The temperature sensors 248 may comprise one or more of the above-described temperature sensors, e.g., thermocouple, mobile environmental condition sensing device, etc. The Tr's generally correspond to the heat load of the heat dissipating racks and therefore the computer systems contained in the racks, e.g., rack 212. Therefore, the Tr's may be based upon the temperatures of specific heat dissipating racks and subsystems. In addition, the Tr's may be based upon the temperatures in the general vicinity of the racks and/or sections of the racks. Thus, those skilled in the art will understand that embodiments of the present invention may be employed to monitor Tr's with temperature sensors 248 located at various positions throughout the room and not only on or near the racks 212. Moreover, use of the term "rack" herein generally refers to racks for supporting computer systems and additionally to sections of the racks as well as areas around the racks. Therefore, the use of the term "rack" throughout the present disclosure is not meant to limit certain aspects thereof to entire racks, but instead, is relied upon to simplify the description of certain embodiments of the present invention.

As an alternative to the temperature sensor 248, the Tr's may be anticipated in the manner described hereinabove and in co-pending U.S. patent application Ser. No. 09/970,707.

At step 340, it is determined whether each of the Tr's is within a predetermined range of operating temperatures, e.g., between a maximum set point temperature (Tmax,set) and a minimum set point temperature (Tmin,set). In general, the range of temperatures Tmin,set and Tmax,set pertains to threshold temperatures to determine whether to increase or decrease the flow of cooling air delivered to the racks. This range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another.

For those racks having Tr's that are within the predetermined range, their temperatures are sensed again at step 335, after the process returns to steps 310 and 315. For those racks determined to have heat loads that do not fall within the predetermined temperature range, i.e., fall outside of Tmin,set and Tmax,set, the controller 286 may determine whether those racks have temperatures that are below the Tmin,set at step 345.

If, at step 345, it is determined that one or more Tr's are less than or equal to the Tmin, set, then the air flow supplied by the evaporator 222, and more particularly the fans 230, configured to supply cooling air flow to the racks having Tr's below or equal to the Tmin,set, may be decreased at step 350. At step 355, the temperatures of the racks are sensed again a subsequent time (Trn). The effect of decreasing the air flow is evaluated at step 360. Here, Trn is compared to Tr, wherein if Trn is greater than Tr, such that decreasing the air flow had its intended effect, then the process returns to step 310. If, however, Trn is not greater than Tr, such that decreasing the air flow did not have its intended effect, then the process proceeds to step 380.

If, at step 345, it is determined that one or more Tr's are greater than Tmin,set, then the air flow may be increased at step 365. In this regard, the controller 286 may increase power to the fans 230 to enable greater air flow to the racks 212. At step 370, the temperatures of the racks are sensed again a subsequent time (Trn). The effect of increasing the air flow is evaluated at step 375. Here, Trn is compared to Tr, wherein if Trn is less than Tr, such that increasing the air flow had its intended effect, then the process returns to step 310. If, however, Trn is not less than Tr, such that increasing the air flow did not have its intended effect, then the process proceeds to step 380.

By virtue of certain embodiments of the invention, racks having various Tr's may be supplied with air flow having various characteristics, e.g., temperature, velocity, direction, and the like. That is, for example, in a system comprising a plurality of evaporators 222, air flow may be supplied to racks having higher Tr's by certain evaporators 222 substantially simultaneously with air flow supplied to racks 212 having relatively lower Tr's by other evaporators 222 where each of the racks 212 receives different levels of air flow. Additionally, the temperature of the refrigerant supplied through the evaporators 222 delivering air flow to racks having higher Tr's may be relatively lower than the temperature of the refrigerant supplied through the evaporators 222 delivering air flow to racks having lower Tr's. It should thus be appreciated that steps 325 and 340 may be respectively and substantially simultaneously performed by various evaporators 222. More particularly, on a zonal level, temperature readings determined at step 335 for various racks may be implemented in varying the delivery of cooling air to the various racks. Additionally, on a global level, the temperature of the cooling fluid may be varied according to the changes in the cooling requirements of the racks. For example, when the temperature of a rack exceeds a predetermined threshold range, the evaporator(s) 222 supplying cooling air flow to that rack may increase the air flow to that rack. Substantially concurrently, the temperature of the cooling fluid may be decreased by an amount relative to the increased rack temperature.

According to an embodiment of the invention, the decrease in volume flow rate and/or velocity of the air flow at step 350 and the increase in volume and/or velocity of the air flow at step 365 may be accomplished by incrementally varying the air flow from the evaporator 222. For example, the volume flow rate and/or velocity of the air flow from the evaporator 222 may be varied by a predetermined amount during a first iteration. The Tr may be measured at a predetermined time following the variation and steps 335–365 may be repeated. By repeating this process a number of times, the temperature of the rack may be substantially brought within the predetermined range without having to adjust refrigerant temperature.

At step 380, one or more of the controllers 286 or 292 and memory 290 or 296 are configured to adapt or learn from errors in a prescribed course of action, i.e. record when the change in air flow at steps 350 and 365 did not have the intended effect of correctly adjusting Tr. Accordingly, the controller(s) can attempt to take an opposite course of action the next time the same or similar condition is present. For example, if an increase in air flow at step 340 resulted in Trn being greater than Tr in a given location, then the controller(s) can learn from this unintended effect and instead decrease the air flow the next time such a condition is present in the given location. In addition, step 380 can be used as input to a computational fluid dynamics tool that will be described in greater detail below.

At step 385, the controller 292 may determine whether to vary the refrigerant temperature, e.g., increase the compressor speed. For example, the refrigerant temperature may be decreased in response to, for example, fan speed and actual and/or detected increases in Tr. In other words, if any fan associated with any evaporator is at maximum speed and a respective Tr (or Tr's) exceed the predetermined temperature range, then the compressor speed can be increased (and vice versa). Thus, the goal in this example is to achieve optimal energy efficiency by permitting the refrigerant to maintain its highest possible temperature, primarily using the fans to deliver cooling air at a temperature and flow rate that is adequate to cool the racks. As such, a lower limit is necessarily placed on fan speed so that a minimum mass flow rate of air is delivered to the room from the evaporators.

If the controller determines not to vary the refrigerant temperature at step 360, then the process returns to step 310 where the superheat is sensed again. In addition, the steps following step 310 may be repeated for an indefinite period of time and may form a closed-loop pattern. Alternatively, if the controller determines to vary the refrigerant temperature at step 360, then the process proceeds to operational mode 400 of FIG. 10.

Figure 10:
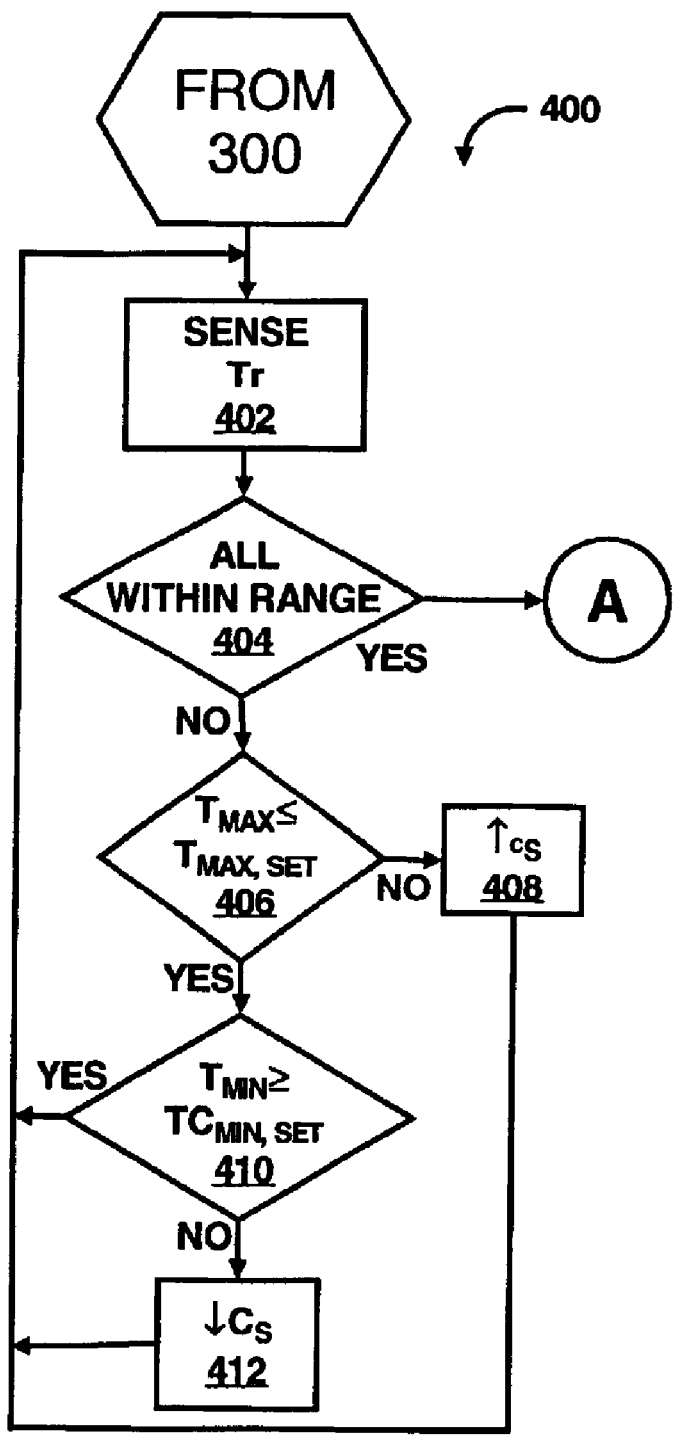
FIG. 10 shows a flow diagram of another operational mode according to the embodiment of FIG. 9.

FIG. 10 is a flow diagram depicting an operational mode 400 in which the embodiment illustrated in FIGS. 6–8 may be practiced. Accordingly, the following description of FIG. 10 will be made with particular reference to those features illustrated in FIGS. 6–8.

In step 402, the temperatures Tr are sensed by respective temperature sensors 248. The Tr measurements are then relayed to a logic controller 292 attached to the refrigeration system PID 260 via the input line 272 and, in step 404, the logic controller 292 determines if the Tr are each within a predetermined range and relays controls to the PID 260 accordingly. The predetermined range is determined based upon system design and the amount of load variability expected among the racks 212. In general, the predetermined range may depend upon the following: system application, compressor size, thermal response time of evaporators, optimization of the system, refrigerant flow rate, etc. If each of the Tr is within the predetermined range, then the logic controller 292 directs the process to return to operational mode 300 at marker A. If any of the Tr is determined to be outside of the predetermined range, the maximum rack temperature ("$T_{MAX}$") of the measured temperatures Tr is compared to a predetermined maximum temperature set point ("$T_{MAX,SET}$") in step 406. The $T_{MAX,SET}$ is determined based upon system design and the amount of load variability expected among the racks 212. In general, the $T_{MAX,SET}$ may depend upon the following: component manufacturers specifications, system application, proximity to dew point, compressor size, thermal response time of evaporators, optimization of the system, refrigeration flow rate, etc.

If, in step 406, the $T_{MAX}$ is determined to be greater than the $T_{MAX,SET}$, the PID 260 may control the compressor 250 via the output line 274 to increase its speed, in step 408. If, in step 406, the $T_{MAX}$ is determined to be less than or equal to the $T_{MAX, SET}$, the minimum rack temperature ("$T_{MIN}$") of the measured temperatures Tr is compared to the predetermined minimum temperature used in the control of the compressor 250 ("$TC_{MIN,SET}$") in step 410. The $TC_{MIN,SET}$ is configured to operate in conjunction with the $TH_{MIN,SET}$. The $TC_{MIN,SET}$ is determined based upon the system design and the amount of load variability expected among the racks 212. In general, the $TC_{MIN,SET}$ may depend upon the following factors: system application, proximity to dew point, compressor size, thermal response time of evaporators, optimization of the system, refrigerant flow rate, etc.

If, in step 410, the $T_{MIN}$ is determined to be less than the $TC_{MIN,SET}$, the PID 260 may control the compressor 250 via the output line 274 to decrease its speed, in step 412. If, in step 410, the $T_{MIN}$ is determined to be greater than or equal to the $TC_{MIN,SET}$, the Tr are measured again in step 402. Additionally, after each step 406 and 410, the Tr are measured again in step 402.

In accordance with embodiments of the present invention, the cooling requirements of a room configured to house computer systems may be analyzed to substantially optimize the layout of the racks within the room. In one respect, the substantial optimization of the rack layout in the room may enable the cooling system of the data center to operate at generally lower energy and greater efficiency levels by virtue of the reduced workload placed on the components of the cooling systems, e.g., compressors, evaporators, etc. In addition, the cooling requirements may be analyzed to optimize the workload of the computer systems as described above. In this regard, the actual or anticipated temperatures may be stored in a look-up table and used as references in optimizing the room layout and/or workload distribution. The cooling requirements within the room may be analyzed by operation of any reasonably suitable commercially available computational fluid dynamics (CFD) tool, e.g., FLOVENT, a 3-D modeling software capable of predicting temperature variations based upon fluid flow analyses.

By virtue of the numerical modeling, various cooling devices as well as the evaporators described hereinabove may be positioned throughout the room to substantially control the manner in which the racks receive the cooling fluid.

In addition, the cooling devices may also be positioned to substantially maximize and optimize their performances, e.g., to prevent one or more of the cooling devices from operating at substantially excessive levels.

In determining the cooling air distribution requirement within the room, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 20 subsystems may have a maximum heat load of 5 KW. By implementing the CFD in this manner, for example in a room containing 100 racks, four cooling devices, and a plurality of evaporators, racks having a potential for relatively larger heat loads may be relatively separately located throughout the data center. In one respect, therefore, the cooling devices and the evaporators within the room may be operated at substantially less than maximum power levels while the racks may receive sufficient amounts of cooling fluid. More specifically, the power required to operate the cooling devices and the evaporators may be regulated to efficiently supply cooling fluid to the racks by providing substantially only that amount of cooling fluid necessary to maintain the racks within nominal operating temperatures.

Additionally, a CFD tool may be implemented substantially simultaneously with the cooling system. More specifically, the CFD tool may be utilized to substantially continuously vary the operation of the cooling system to operate according to the heat loads generated in the racks. In this regard, the anticipated or actual heat loads (e.g., based upon the power draw of the racks) on the racks may be inputted into the CFD tool, along with one or more of the following properties: velocity of the cooling fluid flowing through various sections of the room and the distribution of temperature and pressure of the cooling fluid in the data center, to determine an optimal manner in which, for example, the evaporators may be operated. The velocity of the air flow as well as other atmospheric conditions at various locations within the room may be sensed by a temperature sensor. The sensed conditions may be transmitted or otherwise relayed to the CFD tool to enable the tool to perform the necessary calculations.

In this regard, the CFD tool may be implemented to produce a numerical model of the room to thus determine an optimized cooling distribution within the room. A correlation of one or more of the following properties: velocity of the cooling fluid flowing through various sections of the room, distribution of temperature and pressure of the cooling fluid in the room, and the power draw into the racks, may be created based on the numerical modeling. The correlation may be used to infer thermal conditions throughout the room when only a minimum number of sensors are available during operation of the cooling system. In addition, the correlation may substantially reduce the amount of time required for the CFD tool to perform the computing operations.

By virtue of certain embodiments of the present invention, one of ordinary skill in the art will readily recognize that the amount of energy, and thus the costs associated with cooling the racks located within a room may be substantially reduced. In one respect, by operating the cooling system to supply cooling fluid substantially only as needed by the racks, the cooling system may be operated at a relatively more efficient manner in comparison with conventional cooling systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for cooling a room configured to house a plurality of computer systems, said method comprising:

providing a plurality of evaporator units distributed in series and configured to receive air from said room and to deliver air to said room;

supplying said plurality of evaporator units with refrigerant, wherein said refrigerant is operable to cool said air in said plurality of evaporator units;

sensing temperatures at one or more locations in said room;

controlling the temperature of said air in response to said step of sensing temperatures at said one or more locations;

sensing a downstream temperature of said refrigerant in a position generally downstream of said plurality of evaporator units; and modifying the flow of said refrigerant through said plurality of evaporator units in response to said downstream temperature being outside a predetermined superheat temperature range.

2. The method according to claim 1, further comprising:

providing a refrigeration system configured to manipulate the temperature of said refrigerant, wherein said controlling step comprises varying an output of said refrigeration system to control the temperature of said refrigerant to thereby control the temperature of said air.

3. The method according to claim 2, wherein said refrigeration system comprises a refrigeration loop having a compressor and at least one valve configured to meter the flow of said refrigerant through said plurality of evaporator units, and wherein said step of controlling the temperature of said refrigerant comprises controlling the operation of said compressor.

4. The method according to claim 3, wherein said plurality of evaporator units comprises at least one fan configured to effectuate delivery of said air, and wherein said controlling step comprises varying an output of said fan to control the delivery of said air to said room.

5. The method according to claim 4, further comprising:

determining whether said temperatures at said one or more locations in said room are within a predetermined range.

6. The method according to claim 5, further comprising:

determining whether said temperatures are at least one of less than and equal to a minimum set point temperature in response to said temperatures at one or more locations in said room being outside of said predetermined range.

7. The method according to claim 6, wherein said controlling step comprises at least one of the following steps:

decreasing delivery of said air to said room in response to said temperatures at said one or more locations being at least one of less than and equal to said minimum set point temperature; and increasing delivery of said air to said room in response to said sensed temperatures being above said minimum set point temperature and outside of said predetermined range.

8. The method according to claim 7, further comprising:

sensing temperatures again at one or more locations in said room; and recording whether said decreasing and said increasing steps had their intended effect.

9. The method according to claim 8, further comprising:

using said recording step to provide input to performing a numerical modeling of temperature distribution and flow characteristics of said air within said room.

10. The method according to claim 5, further comprising:

varying the temperature of said refrigerant in response to said temperatures at one or more locations in said room being outside of said predetermined range.

11. The method according to claim 9, further comprising:

manipulating at least one valve to decrease the mass flow rate of said refrigerant through said plurality of evaporator units when said downstream temperature is below a predetermined superheat set point; and manipulating said at least one valve to increase the mass flow rate of said refrigerant through said plurality of evaporator units when said downstream temperature is above said predetermined superheat set point.

12. The method according to claim 9, further comprising:

modifying the speed of said compressor in response to said temperatures at said one or more locations in said room being outside a predetermined temperature range.

13. The method according to claim 12, further comprising:

increasing the speed of said compressor in response to a maximum temperature of said temperatures at said one or more locations in said room exceeding or equaling a predetermined maximum temperature set point; and decreasing the speed of said compressor in response to a minimum temperature of said temperatures at said one or more locations in said room being less than or equal to a predetermined minimum temperature set point.

14. The method according to claim 1, further comprising:

performing a numerical modeling of temperature distribution and flow characteristics of said air within said room; and manipulating said refrigeration system in response to said numerical modeling.

15. The method according to claim 14, further comprising:

implementing said numerical modeling to correlate at least two of temperature, velocity and pressure of said refrigerant and power draw of said plurality of computer systems to thereby infer a thermal condition throughout said room, wherein said controlling step further comprises manipulating said refrigeration system in response to said thermal condition.

16. The method according to claim 1, wherein said step of sensing temperatures at one or more locations in said room comprises sensing said temperatures with a mobile environmental condition sensing device.

17. The method according to claim 1, wherein said step of sensing temperatures at one or more locations in said room comprises determining said temperatures according to anticipated heat loads of one or more of said plurality of computer systems.

18. The method according to claim 1, further comprising:

manipulating the workload on said plurality of computer systems to optimize energy efficiency in cooling said plurality of computer systems.

19. The method according to claim 1, wherein said controlling step comprises substantially ceasing delivery of said air and of said refrigerant in response to said temperatures at said one or more locations within said room being below a predetermined set point temperature.

20. A system for cooling a room containing a plurality of computer systems, said system comprising:

a plurality of evaporator units distributed in series and configured to receive refrigerant through a refrigerant line and to receive air, wherein said air may be cooled through heat transfer with said refrigerant, said plurality of evaporator units having at least one fan configured to cause said air to flow out of said plurality of evaporator units;

an evaporator controller operable to control a supply of said refrigerant to said plurality of evaporator units and operable to control the speed of said at least one fan;

a refrigeration system for cooling said refrigerant;

a refrigeration system controller configured to operate said refrigeration system to vary the temperature of said refrigerant;

at least one valve configured to meter the flow of said refrigerant through said plurality of evaporator units positioned along said refrigerant line generally upstream of said plurality of evaporator units, wherein said refrigeration system controller is operable to control the mass flow rate of said refrigerant through said at least one valve; and wherein said at least one valve comprises a valve upstream of said plurality of evaporator units, said valve being connected to a sensor to detect superheat in said refrigerant exiting said plurality of evaporator units, said valve being operable to vary the mass flow rate of said refrigerant through said plurality of evaporator units based upon said detected superheat, to thereby control the amount of refrigerant superheat formed in the plurality of evaporator units.

21. The system according to claim 20, further comprising one or more temperature sensors, wherein said evaporator controller is configured to receive environmental condition information from said one or more temperature sensors.

22. The system according to claim 21, wherein said one or more temperature sensors comprises at least one of a thermocouple and a mobile environmental condition sensing device.

23. The system according to claim 20, wherein said plurality of computer systems are housed in a plurality of racks, and wherein said plurality of evaporator units are positioned at various locations in said room to supply air flow to said plurality of racks in a substantially independent manner.

24. The system according to claim 23, further comprising:
a variable speed compressor for varying a mass flow rate of said refrigerant through said refrigerant line; and
a refrigeration system controller configured to control said variable speed compressor.

25. The system according to claim 20, wherein said valve is a thermostatic expansion valve.

26. The system according to claim 20, wherein said plurality of evaporator units are configured for thermal proximal assignment to said plurality of computer systems, and wherein said mass flow rate of said refrigerant through said plurality of evaporator units is configured to be controlled according to a heat load applied to said refrigeration system.

27. The system according to claim 26, further comprising:
said refrigeration system controller being operable to control the capacity of said compressor through an output line connected between said refrigeration system controller and said compressor;
a plurality of input lines connected between said refrigeration system controller and a plurality of temperature sensors attached to respective computer systems of said plurality of computer systems; and
wherein said refrigeration system controller is operable to control the capacity of said compressor in response to temperature measurements transmitted to said refrigeration system controller by said plurality of temperature sensors.

28. The system according to claim 27, wherein said refrigeration system controller comprises a proportional, integral, derivative controller with a relay.

29. The system according to claim 20, wherein said refrigeration system controller is configured for communication with said evaporator controller.

30. The system according to claim 29, wherein said communication between the refrigeration system controller and the evaporator controller includes communication of information pertaining to the level of operation of said plurality of evaporator units, and wherein said refrigeration system controller is configured to operate at least one of said variable capacity compressor, said plurality of evaporator units, and said at least one fan in response to said information.

31. The system according to claim 29, wherein said communication comprises at least one of temperature measurements and plurality of evaporator units operations.

32. The system according to claim 31, wherein said plurality of evaporator units is supported from a ceiling of said room.

33. The system according to claim 31, further comprising:
a connecting line between a supply portion of said refrigerant line and a return portion of said refrigerant line; and
a valve configured to meter the flow of said refrigerant through said connecting line, wherein said evaporator controller is operable to control the flow of said refrigerant through said valve.

34. A system for cooling computer systems housed in one or more racks, said racks being maintained in a room, said system comprising:
means for cooling air including comprising a plurality of evaporator units distributed in series and further comprising means for receiving refrigerant;
means for delivering cooled air to said plurality of computer systems;
means for measuring temperatures at one or more locations in said room;
means for controlling delivery of said cooled air in response to said means for measuring;
means for controlling the temperature of said refrigerant;
means for sensing a downstream temperature of said refrigerant in a position generally downstream of said plurality of evaporator units; and
means for modifying the flow of said refrigerant through said plurality of evaporator units in response to said downstream temperature being outside a predetermined superheat temperature range.

35. A computer readable storage medium on which is embedded one or more computer programs, said one or more computer programs implementing a method of cooling a room configured to house a plurality of computer systems, said one or more computer programs comprising a set of instructions for:
providing a plurality of evaporator units distributed in series and configured to receive air from said room and to deliver air to said room;
supplying said plurality of evaporator units with refrigerant, wherein said refrigerant is operable to cool said air in said plurality of evaporator units;
sensing temperatures at one or more locations in said room; and
controlling the temperature of said air in response to said temperatures at said one or more locations;
sensing a downstream temperature of said refrigerant in a position generally downstream of said plurality of evaporator units; and
modifying the flow of said refrigerant through said plurality of evaporator units in response to said downstream temperature being outside a predetermined superheat temperature range.

36. The computer readable storage medium according to claim 35, said one or more computer programs further comprising a set of instructions for:

providing a refrigeration system configured to manipulate the temperature of said refrigerant, wherein said controlling step comprises varying an output of said refrigeration system to control the temperature of said refrigerant.

* * * * *